(12) United States Patent
Zykin et al.

(10) Patent No.: US 10,128,426 B1
(45) Date of Patent: Nov. 13, 2018

(54) LS CORE LED CONNECTOR SYSTEM AND MANUFACTURING METHOD

(71) Applicants: Andrey Zykin, Getzville, NY (US); Alcinda Miller, Emigrant, MT (US)

(72) Inventors: Andrey Zykin, Getzville, NY (US); Alcinda Miller, Emigrant, MT (US)

( * ) Notice: Subject to any disclaimer, the term of this patent is extended or adjusted under 35 U.S.C. 154(b) by 291 days.

(21) Appl. No.: 14/989,184

(22) Filed: Jan. 6, 2016

Related U.S. Application Data

(63) Continuation-in-part of application No. 14/076,711, filed on Nov. 11, 2013.

(51) Int. Cl.
*H01L 33/62* (2010.01)
*H01L 33/64* (2010.01)
*H01L 25/075* (2006.01)

(52) U.S. Cl.
CPC ........ *H01L 33/647* (2013.01); *H01L 25/0753* (2013.01); *H01L 33/62* (2013.01)

(58) Field of Classification Search
CPC .... F21K 9/20; F21K 9/90; F21K 9/232; F21S 4/24; F21S 4/26; F21S 4/28; F21S 4/00; F21V 19/0025; F21V 21/005; F21V 23/06; F21Y 2103/10; F21Y 2115/10; H01L 2224/48137; H01L 2224/48227; H01L 2224/48247; H01L 2224/73265; H01L 24/97; H01L 25/0753; H01L 33/002; H01L 33/48; H01L 33/62; H01L 33/486
See application file for complete search history.

(56) References Cited

U.S. PATENT DOCUMENTS

| | | | | |
|---|---|---|---|---|
| 4,011,575 A | * | 3/1977 | Groves | H01L 25/0753 257/91 |
| 4,322,735 A | * | 3/1982 | Sadamasa | G09F 9/33 257/666 |
| 7,594,738 B1 | | 9/2009 | Lin et al. | |
| 7,708,427 B2 | * | 5/2010 | Baroky | F21K 9/00 257/98 |
| 7,714,346 B2 | | 5/2010 | Ogawa et al. | |
| 7,988,332 B2 | * | 8/2011 | Lo | F21S 4/006 362/246 |
| 9,046,228 B2 | * | 6/2015 | Tanaka | B60Q 1/04 |
| 2003/0193803 A1 | * | 10/2003 | Lin | F21S 4/24 362/249.04 |
| 2004/0252501 A1 | * | 12/2004 | Moriyama | F21V 19/0025 362/238 |
| 2005/0007033 A1 | | 1/2005 | Kan et al. | |
| 2005/0127833 A1 | | 6/2005 | Tieszen | |
| 2008/0224161 A1 | * | 9/2008 | Takada | H01L 33/486 257/98 |
| 2008/0296604 A1 | * | 12/2008 | Chou | H01L 33/62 257/99 |
| 2009/0009997 A1 | | 1/2009 | Sanfilippo et al. | |
| 2011/0062875 A1 | * | 3/2011 | Altamura | H05B 37/036 315/192 |

(Continued)

*Primary Examiner* — Hargobind S Sawhney
(74) *Attorney, Agent, or Firm* — Luis Figarella

(57) ABSTRACT

The present invention relates to a new method, system and apparatus for light emitting diode (LED) packages. An object of the present invention is to provide an LED package having reduced components, a superior heat dissipation property and a compact structure that is easy to assemble, does not largely restrict use of conventional equipment for its manufacture, and is compatible with implementation within present illumination devices packaging.

18 Claims, 36 Drawing Sheets

(56) References Cited

U.S. PATENT DOCUMENTS

| | | | |
|---|---|---|---|
| 2011/0211339 A1* | 9/2011 | Hung | F21K 9/90 362/184 |
| 2011/0249469 A1 | 10/2011 | Lee et al. | |
| 2011/0267814 A1* | 11/2011 | Moon | F21V 23/06 362/235 |
| 2014/0131741 A1 | 5/2014 | Zykin et al. | |
| 2014/0268779 A1* | 9/2014 | Sorensen | F21K 9/232 362/249.06 |

* cited by examiner

3502

3602

3702

104

LS CORE LED CONNECTOR SYSTEM AND MANUFACTURING METHOD

CROSS-REFERENCE TO RELATED APPLICATIONS

This application is a continuation-in-part of pending U.S. Appl. "LED Spirit Connector System and Manufacturing Method", Ser. No. 14/076,711, filed on Nov. 11, 2013.

PATENTS CITED

The following documents and references are incorporated by reference in their entirety, Ogawa et al (U.S. Pat. No. 7,714,346), Kang et al (U.S. Pat. No. 7,642,563), Mok et al (U.S. Pat. No. 7,262,438) and Zykin (U.S. patent application Ser. Nos. 13/313,129 and 14/076,682).

FIELD OF THE INVENTION

The present invention relates to Light Emitting Diodes (LEDs) mounting within electrical and mechanical structures, and in particular to devices, systems and methods for the efficient and inexpensive removal of heat from the LEDs in LED light fixtures.

DESCRIPTION OF THE RELATED ART

LEDs promise to revolutionize illumination, through their ultra efficient conversion of energy into visible light. Within a decade, we have gone from illumination provided by a 60 W incandescent light bulb being replaced by a 13 W Compact Fluorescent Light bulb (CFL) to a 3 W LED light bulb. In effect, reducing by over 90% the consumption required for similar illumination. The above is not only important because it saves energy, but also because now we can illuminate the world without the need to electrify the world.

An LED is an element in which electrons and holes are combined in a P-N semiconductor junction structure by application of current thereby emitting certain types of light. LEDs are typically formed to have a package structure, in which an LED chip is mounted on a mechanical carrier, frequently referred to as an "LED package." Such an LED package is generally mounted on a printed circuit board (PCB) and receives current applied from electrodes formed on the PCB to thereby emit light.

In general illumination applications, engineers have discovered the importance of generating light in a 360 deg. envelope, not unlike the way in which an incandescent filament illuminates. To accomplish such goals, a new type of package termed an LED sticks or LED straw has been created. In it, individual LEDs are serially placed along a thin sleeve or slice of material, typically made of a sapphire or ceramic material. The stick is powered from each end, creating a stick of light.

In an LED package, heat generated from the LED chip has a direct influence on the light emitting performance and life span of the LED package. When heat generated from the LED chip is not effectively removed, dislocation and mismatch occur in a crystal structure of the LED chip. In effect, brightness is related to power applied, so a large amount of heat is generated in an LED chip due to the high currents, heat that must be typically transferred to a heat sink, typically, a separate device for effectively dissipating the generated heat is required.

LEDs are typically mounted on printed circuit boards (PCBs), which are used to mechanically support and electrically connect the LEDs to electronic drivers (power supplies, amplifiers, etc.) using conductive pathways, tracks or signal traces etched from copper sheets laminated onto a non-conductive substrate. This substrate is typically a dielectric or insulator. Some of these dielectrics include Teflon, FR-4, FR-1, CEM-1 or CEM-3.

The above has a significant limitation, the thermal transfer from the LED package to the heat sink, is going through a plastic, not the optimal way in which to efficiently transfer heat. What is needed, is a way in which to mechanically support and electrically connect the LED package to a heat sink with the highest efficiency possible.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In one aspect, the invention is about an LED light source assembly comprising a first metal wire frame extending along one side of said assembly and a second metal wire frame extending along the other side of said assembly, wherein said first metal frame has one or more first branches electrically connected to said first frame, with each said first branch bar forming the first link of an LED chain and forming part an of an LED base to which all or part of an LED chip is mounted, and said first branch also being separated from said second frame by a gap, a sequence of one or more cascade power bars forming the links in said LED chain, with each cascade bar having a first end and a second end, wherein said first end of said first cascade bar is across said first branch LED pad gap and said gap is electrically spanned in order to connect said LED chip across said LED pad gap, and said second cascade bar end forms an LED pad separated from the subsequent cascade bar within said LED chain by a similar LED gap which is similarly electrically spanned until the final cascade bar within said LED chain is reached, a final branch located across an LED pad gap from said final cascade bar within said LED chain, so that said LED pad gap for said final LED chip in said LED chain is electrically spanned across said gap, wherein said final branch is electrically connected to said second wire frame upper portion and one or more molded structures mechanically connecting two or more of the group comprised by said first frame, second frame, first branch, final branch and/or cascade power bars at one or more locations.

In another aspect, said molded structures comprise a first molded structure making contact at one or more points with said first frame, said first and said final branches and one or more of said cascade branches and said molded structures comprise a second molded structure making contact at one or more points with said second frame, said first and final branches and one or more of said cascade branches. In yet another aspect, said LED pad gap is electrically spanned using wire bond techniques. In one aspect, one or more of said LED chain(s) are inserted into a container shaped as a tube and secured within said tube by one or more of said LED chain's LED package holder leads. In one aspect one or more of said LED package holder leads are secured to slots within said tube interior. In another aspect, one or more of said LED chain(s) are inserted into a container shaped as a bulb or lamp. In yet another aspect, two or more of said LED chains are concatenated to form a supra chain. In another aspect, said supra chain is inserted into a container shaped as a tube and secured within said tube by said LED leads. In yet another aspect said LED pad gap is electrically spanned using flip chip technology.

In one aspect said molded structures comprise two or more molded structures, each said structure making contact with two or more points from the following structures; said first frame, said first branch, said final branch and one or more of said cascade branches. In another aspect, said LED pad gap is electrically spanned using wire bond techniques. In yet another aspect said LED pad gap is electrically spanned using flip chip technology.

In one aspect, the invention is about an LED light source assembly comprising: an LED strip formed of LED assemblies, said strip having two or more groups of leads; each said lead inserted into either a compression fitting within the appropriate first strip or second strip. In another aspect, said LED strip is formed of individual LEDs. In yet another aspect, said LED strip is formed of LED sticks.

Other features and advantages of the present invention will become apparent upon examining the following detailed description of an embodiment thereof, taken in conjunction with the attached drawings.

Figure 1:
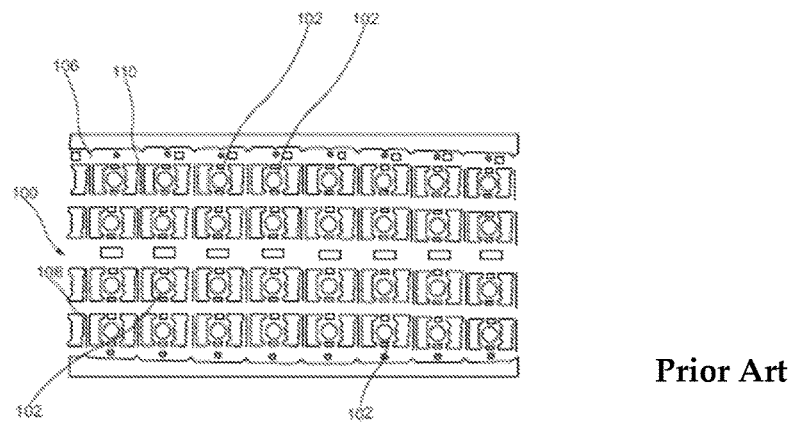
FIGS. 1-4 show some prior art illustrations for LED technology.
Figure 2:
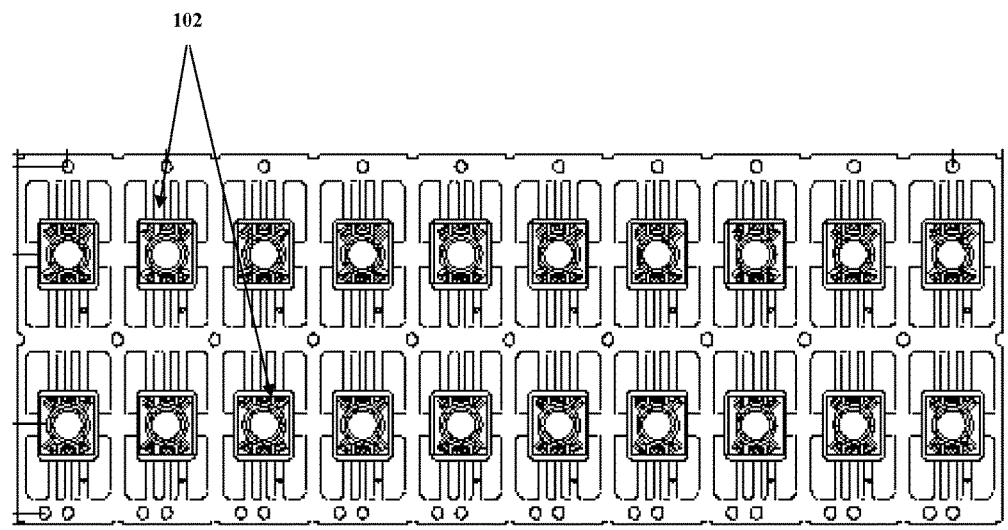
Figure 3:
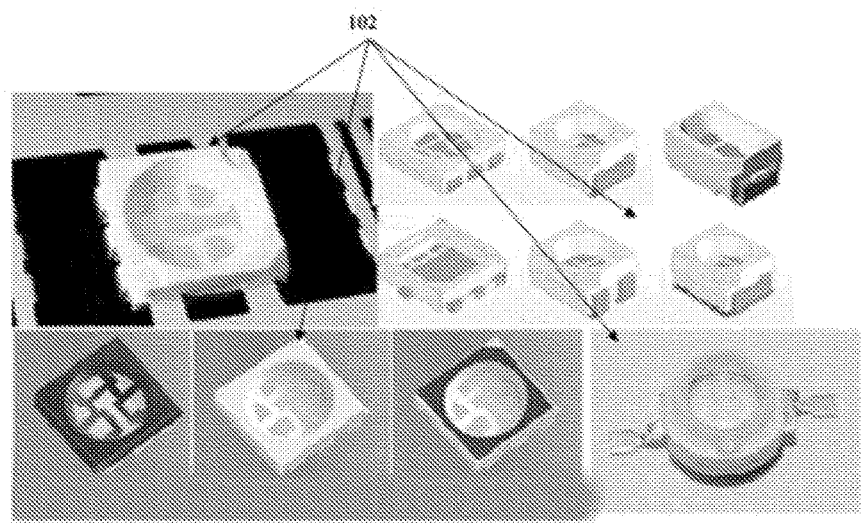
Figure 4:
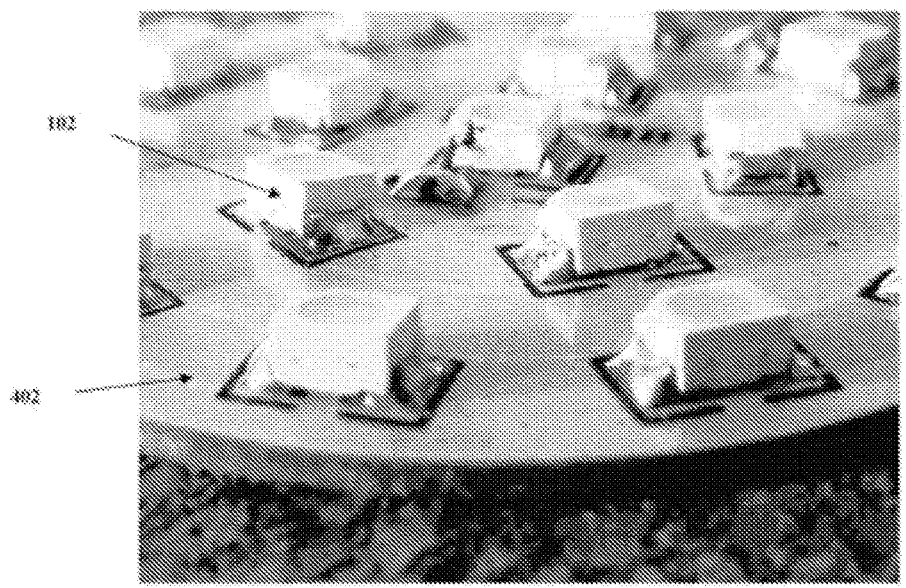
Figure 5:
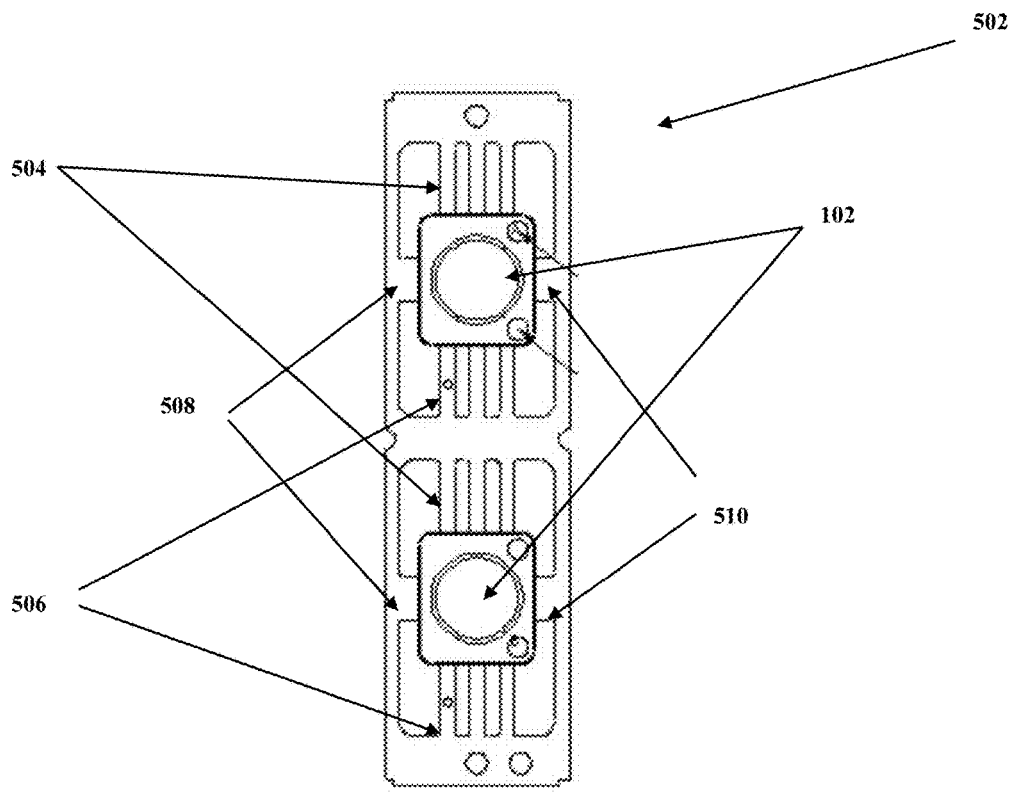
FIGS. 5-11 show illustrations of the improved LED mechanical/electrical packaging options, according to exemplary embodiments of the invention.
Figure 6:
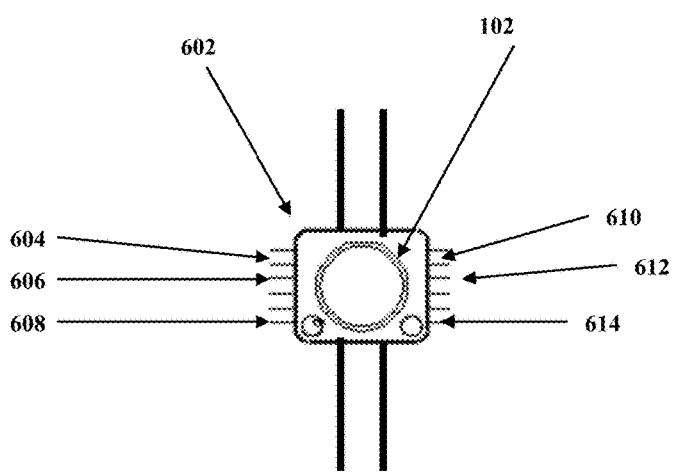
Figure 7:
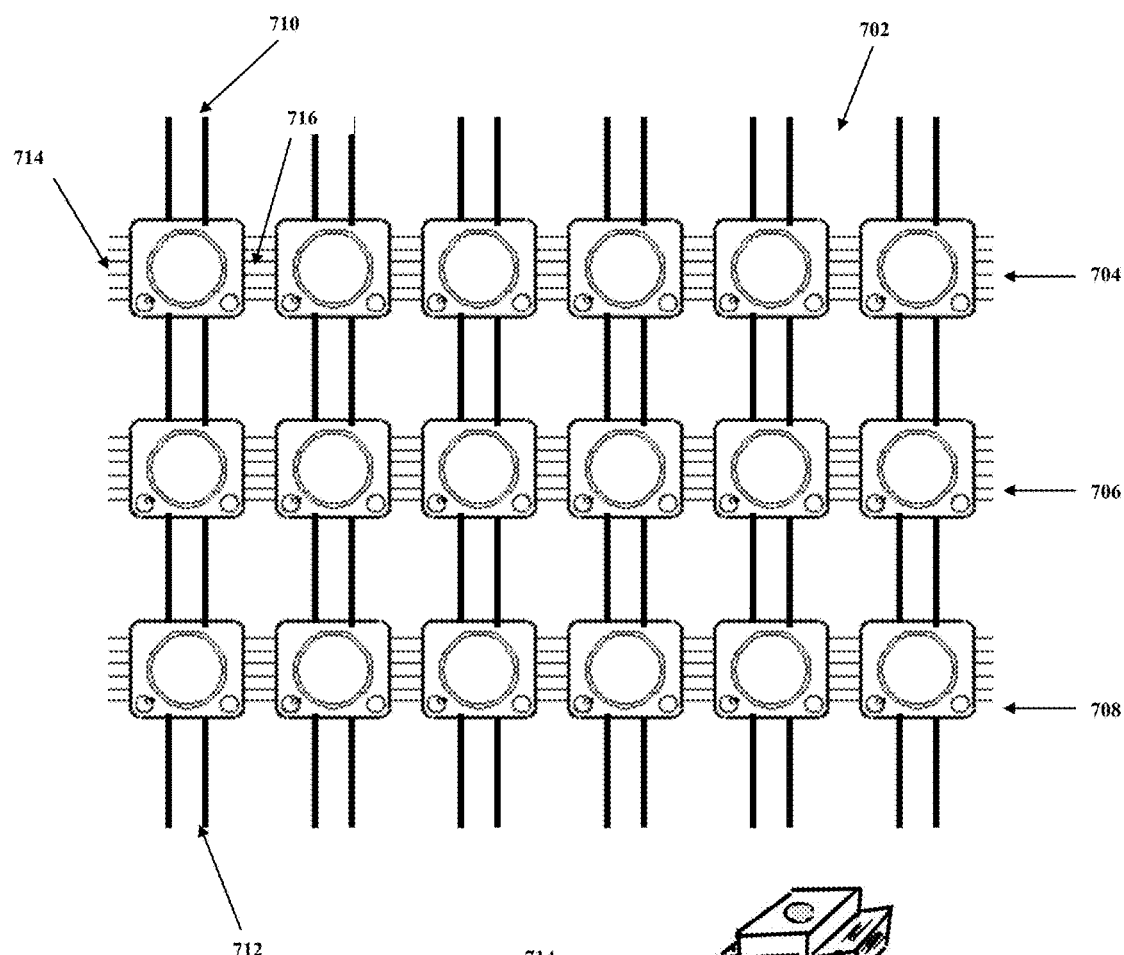
Figure 8:
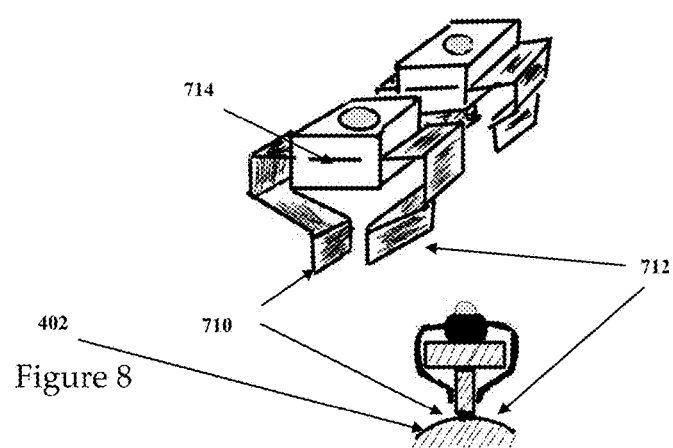
Figure 9:
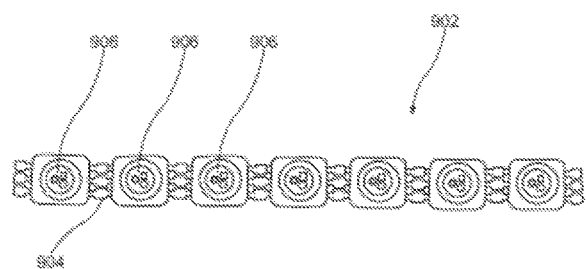
Figure 10:
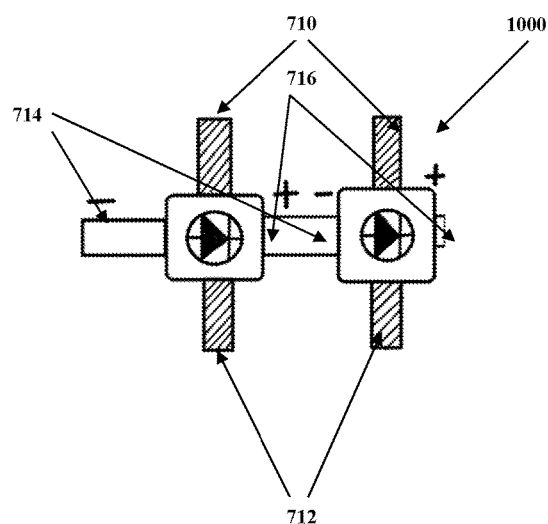
Figure 11:
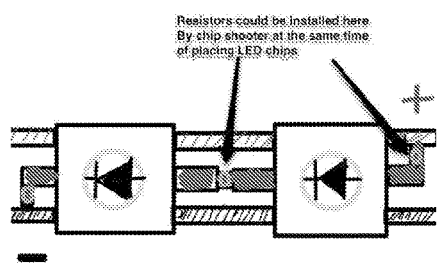

The above-described and other features will be appreciated and understood by those skilled in the art from the following detailed description, drawings, and appended claims.

DETAILED DESCRIPTION OF THE PREFERRED EMBODIMENT

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

To provide an overall understanding of the invention, certain illustrative embodiments and examples will now be described. However, it will be understood by one of ordinary skill in the art that the same or equivalent functions and sequences may be accomplished by different embodiments that are also intended to be encompassed within the spirit and scope of the disclosure. The compositions, apparatuses, systems and/or methods described herein may be adapted and modified as is appropriate for the application being addressed and that those described herein may be employed in other suitable applications, and that such other additions and modifications will not depart from the scope hereof.

Simplifications or omissions may be made to avoid obscuring the purpose of the section. Such simplifications or omissions are not intended to limit the scope of the present invention. All references, including any patents or patent applications cited in this specification are hereby incorporated by reference. No admission is made that any reference constitutes prior art. The discussion of the references states what their authors assert, and the applicants reserve the right to challenge the accuracy and pertinence of the cited documents. It will be clearly understood that, although a number of prior art publications are referred to herein, this reference does not constitute an admission that any of these documents form part of the common general knowledge in the art.

As used in the specification and claims, the singular forms "a", "an" and "the" include plural references unless the context clearly dictates otherwise. For example, the term "a transaction" may include a plurality of transaction unless the context clearly dictates otherwise. As used in the specification and claims, singular names or types referenced include variations within the family of said name unless the context clearly dictates otherwise.

Certain terminology is used in the following description for convenience only and is not limiting. The words "lower," "upper," "bottom," "top," "front," "back," "left," "right" and "sides" designate directions in the drawings to which reference is made, but are not limiting with respect to the orientation in which the modules or any assembly of them may be used.

It is acknowledged that the term 'comprise' may, under varying jurisdictions, be attributed with either an exclusive or an inclusive meaning. For the purpose of this specification, and unless otherwise noted, the term 'comprise' shall have an inclusive meaning—i.e. that it will be taken to mean an inclusion of not only the listed components it directly references, but also other non-specified components or elements. This rationale will also be used when the term 'comprised' or 'comprising' is used in relation to one or more steps in a method or process.

Referring to FIGS. 1-4, we see the traditional lead frames or lead LED frames 100, which are used today to distribute and ship LED packages 102 (said packages comprised of both lensed LED packages and non-lensed ones) throughout the industry. These frames consist of a lattice 106 having one or more orthogonal horizontal 108 and vertical 110 members that hold the LEDs in place, and are used for shipping from LED mfr. to the LED light fixture assembly mfr.

At the light fixture mfr. site, the LEDs 102 are cut off from the frame strips lattice members 108, 110 and become loose, independent, individual light-emitting diodes LEDs 102. During manufacturing, the LEDs 102 are then soldered onto a printed-circuit board (PCB) 402.

The above has a large number of disadvantages, one of the primary ones being the fact that the already aligned and prepositioned LEDs 102 are loosened, before being re-attached to the PCB 402. This step requires machinery to align and position the LEDs 102. The proposed solution described here is to completely eliminate the PCB 402 used to position the LEDs 102 by making certain changes to the Lead LED Frame (LLF) 100 when manufacturing the LEDs 102. In the traditional method the LEDs 102 are first stamped out, pressed from plastic, electrical and other holders made, crossing points, etc. cut off and then the LEDs are created, then cut off from the frame 100, sorted, aligned and then soldered to PCB.

Referring to FIGS. 5-11, we see the present lead frame arrangement 502 vs. the proposed new 602 LED connector or chain and manufacturing method in a proposed embodiment. In the present method (intended for a PCB line), one or more LED 102 electrical contacts are formed on either side of the LED package 102 (side one 504 and side two 506). These are the electrical leads used to power the LED, which are later bent for surface mount attachment to the PCB). The LED is held to the frame by the LED holders 508, 510 which are usually on two remaining sides of the LED package. These are used to hold the LED package to the lead frame, and are later cut-off after the LED 102 is manufactured.

In one embodiment of the present invention 602, the LEDs 102 are rotated 90 degrees in the design for the forming machine, so that the one or more electrical contacts 604, 606, 608, 610, 612, 614 are formed along each side forming the rows of the lead frame (and between neighboring LEDs), and the LED holders 508, 510 (not electrically connected to the LED) are extended along the column to provide support for the inner members. In one embodiment, the LEDs 102 are connected as a long single-pearl string 902, by a joint 904 between each LED 102. Note the LED chips 906 are placed within the enclosures.

Power is applied at one end, and flows along the row to power each LED 102 by a suitable power source. After so many LEDs, the LED chain may require electrical ending. However a light fixture formed by a chain of LED chains (say a supra chain) formed by the mechanical linkage of two or more LED chains, with separate electrical power connections going to the various LED chains integrating the supra chain. If required, resistors and other components may be stamped along each or every so many of the LEDs 102 joints 904.

In another embodiment, the individual LEDs 102 are assembled or stamped into a two dimensional matrix 702 in which the rows 704, 706, 708 share the power connections (an LED matrix formed of LED chains). As before, the connections between neighbors along the rows are connected through traditional metal stamping techniques, and may include resistors and other components placed at either the ends or after a number of LEDs. The electrical power connection is attached at either end of a number of LEDs on a column, and daisy chained along the row of the matrix. Resistors such as these are typically used as current limiters to prevent against overdriving of the electronics. Within the columns (i.e. up/down), the LED leads are left uncut, so that within two or more neighboring rows of said LED chains, at least one said LED package occupying the same respective column position within said matrix has at least one of said package upper and/or lower LED lead connected to its respective counterpart above or below it within said matrix.

As before, for electrical reasons the above matrix may be powered column-wise (with the power supply connected along the LED's occupying the first and last columns), or as a supra chain (where the end of each matrix row) is electrically connected to the beginning of another row within the column. Said LED matrix may then be bent into tube, squares or any other suitable shape.

In one embodiment, the LED holder leads 508, 510 (described as upper and lower in reference to the left/right of the power connectors within each LED package) are not cut or clipped, but instead formed as clips, clamps and/or springs along its length or at/near their end 710, 712 so as to mechanically and thermally attach the LEDs to the heat sink 1000. While electrically isolated through either special coatings or encapsulation, they are thermally connected to the LED 102 package, so that efficient, metal-to-metal heat transfer channels are provided. Note a further advantage of this approach, is that these holder leads 508, 510 act as radiating heat sinks.

For non-open collector diodes, the above allows for the voltage connections 602 (as well as 604, 606, 608, 610, 612, 614 and any others) to be held above the datum plane of any heat sink, allowing for the insulation of air to keep voltages from mixing or short-circuiting. Such an approach affords the opportunity to build an electrically connected electrical lead frame with no PCB that is capable of operating in a similar way. In an alternate embodiment, the electrical insulation of the voltage channels (714,716) is accomplished by elevating these above the datum of the heat sink 402.

Figure 12:
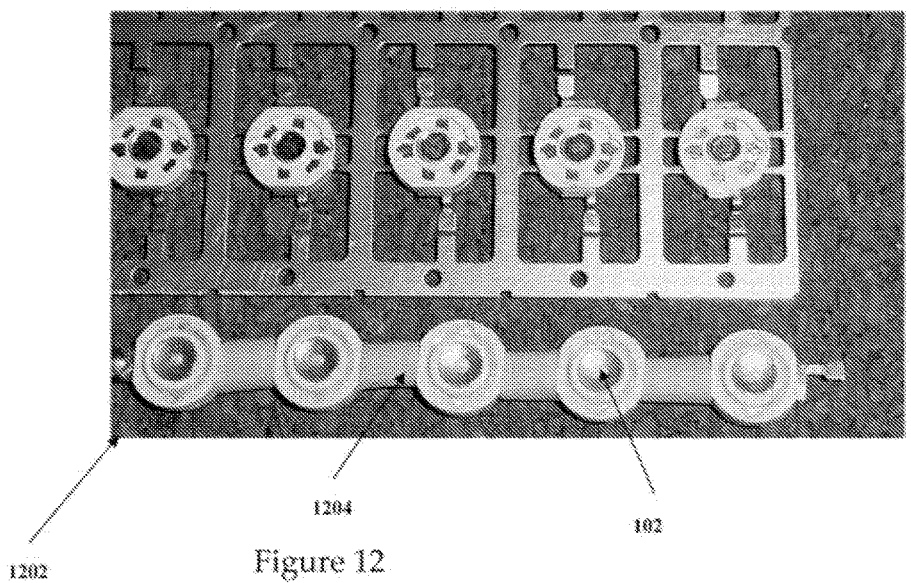
FIGS. 12-15 show illustrations of LED packaging options, according to exemplary embodiments of the invention.
Figure 13:
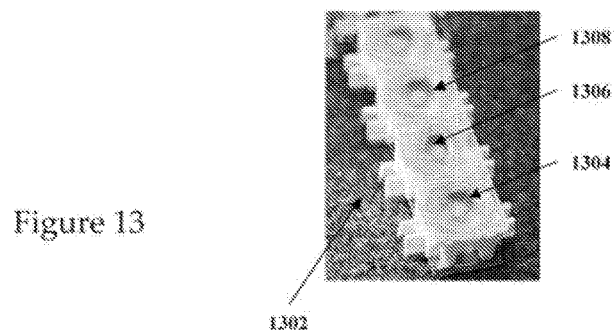

In alternate embodiments (FIGS. 12-13) such a linear 'necklace' or LED strip 1202 is formed when all LEDs 102 are connected through traditional technological interconnectors and holders capable of manufacturer through traditional precise micro-molding injection. In one such embodiment, an encapsulated electrical connection 1204 instead of the PCB carries out the electrical interconnections and mechanical holders between LEDs 102. In such a connection there is no soldering, and all connections represent monolithic, isolated electrical links within an insulated housing.

The plastic housing 1302 of the LED 102 may be configured so that the snap-on of the plastic creates the electrical connections between LEDs 102, which greatly increases reliability and durability of contacts between packages 1304, 1306, 1308, transitional electro resistance decreases because of no soldering points.

Figure 14:
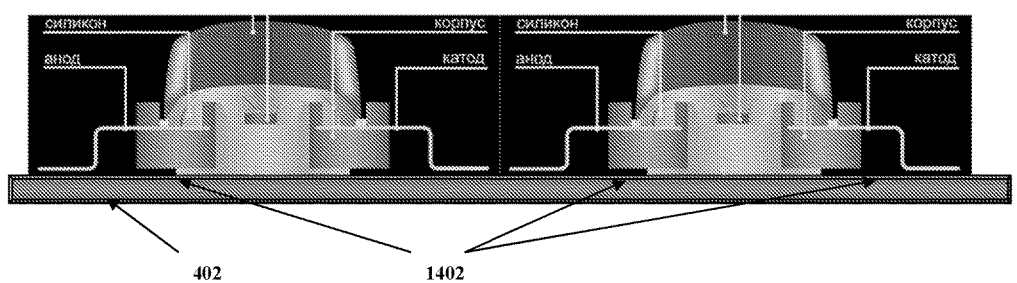
Figure 15:
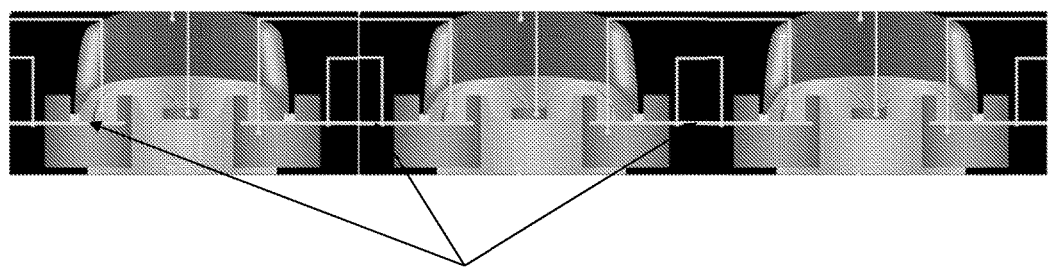

Referring to FIGS. 14-15, we see the difference between the LED 102 package attached to the PCB or heat sink 402 by solder 1402, versus the new approach wherein in one embodiment, the connection between the various LED packages 102 is accomplished by wires 1502. Of critical importance is the fold in the connection between LEDs, which is formed as a S or Z or fold in one embodiment, allowing flexible bending of the connection between LEDs.

Figure 16:
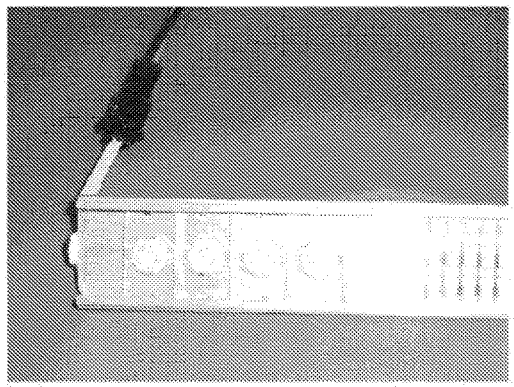
FIGS. 16-41 show illustrations of improved mechanical/electrical/heat dissipation options, according to exemplary embodiments of the invention.
Figure 17:
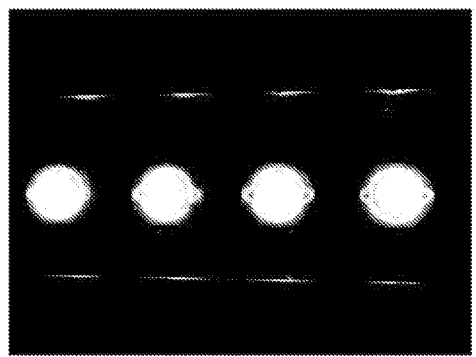
Figure 18:
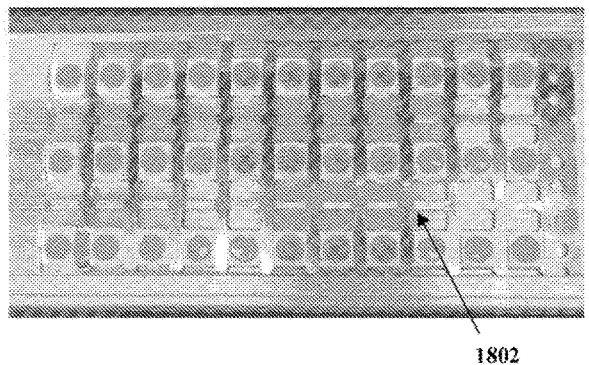
Figure 19:
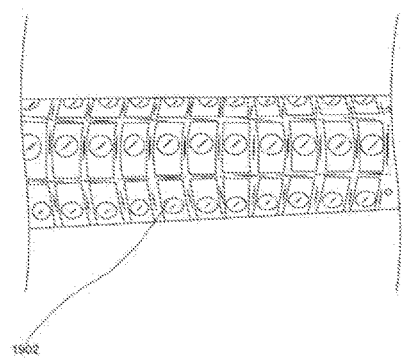
Figure 20:
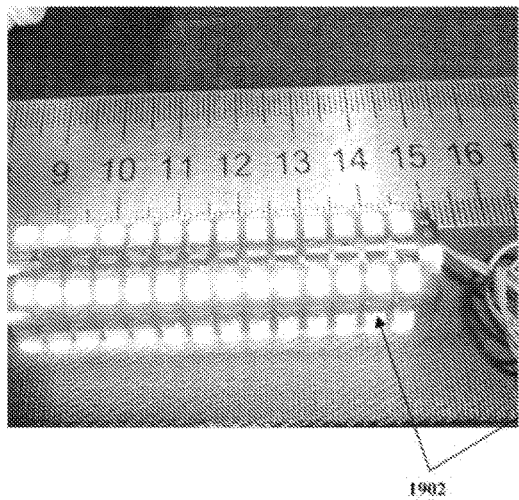
Figure 21:
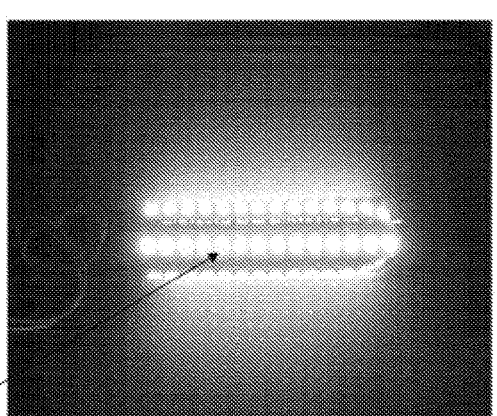

Referring to FIGS. 16-17 we illustrate a PCB-less system as part of a fluorescent bulb replacement for the T-5 and T-8 bulb standards. As can be seen, the LEDs may be arranged linearly or in matrix form. It should be noted that the lack of a PCB provides for a much wider angle of light (as the PCB does not cause a shadow).

Figure 22:
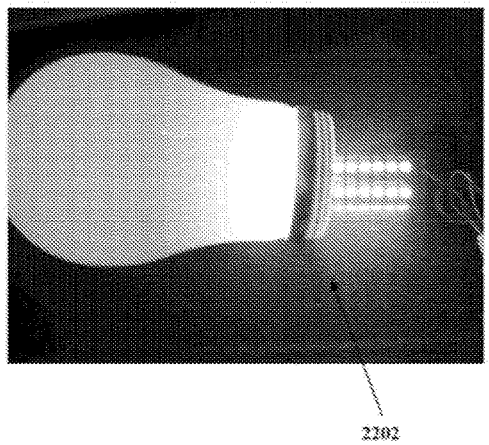
Figure 23:
Figure 24:
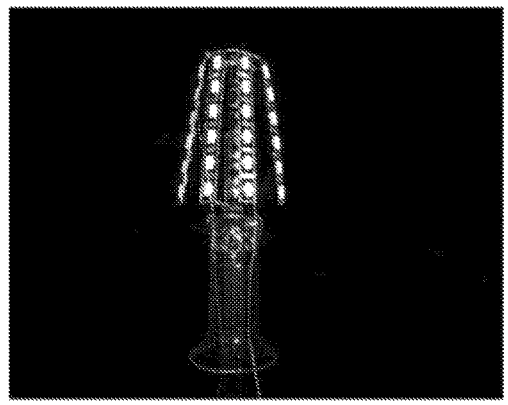

Referring to FIGS. 18-21, we see an embodiment where three or more parallel strips 1802 of LEDs are formed into an LED matrix that may be then shaped cylindrical form or LED roll 1902 and powered from one end to the other. The flexibility stated before, can be appreciated in an embodiment where the LED roll 1902 is fitted inside the body of a traditional light bulb or lamp volume 2202 (FIG. 22) is used to provide Omni-directional light. In an alternate embodiment (FIGS. 23-24), the LED roll is shaped as a tapered cone, improving the light distribution.

Figure 25:
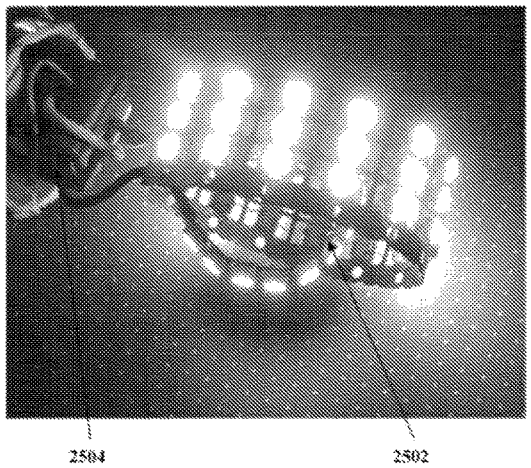

In an alternate embodiment (FIG. 25), a flexible matrix lattice arrangement 2502 is curved to fit within the contour of the bulb, lamp or a linear package. Note the driving electronics may be located within the base of the bulb 2504.

Figure 26:
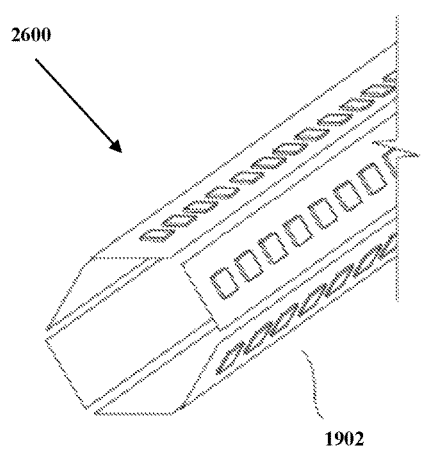
Figure 27:
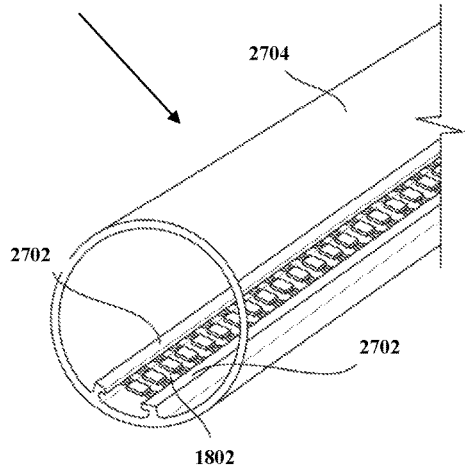

In an alternate embodiment (FIG. 26), the LED roll 1902 is formed and inserted within a tube (such as a T-5/T-8 or other similar extended tube), so that they may replace a fluorescent tube within such a light fixture. In one an alternate embodiment (FIG. 27), one or more strips 1802 formed of one or more LED chips 906 are inserted within one or more slots 2702 built into said tube 2704 or they may be formed into a LED tube or cylinder 1902 and then inserted into the enclosure tube 2704.

Said enclosure tube may have the aforementioned slots 2702. Note that in all enclosure cases, i.e. bulbs, lamps or the T-5/T-8 tubes 2704, there could be introduced into the enclosure space a gas mix. Besides a gas mix, the complete lighting package may be immersed in a cooling fluid, which may be a dielectric to preserve electrical integrity while providing cooling. Such fluids may include inert gases.

Figure 28:
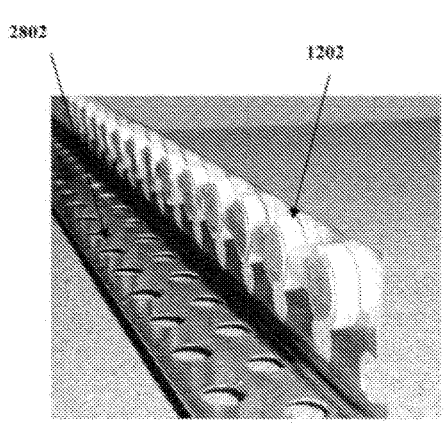
Figure 29:
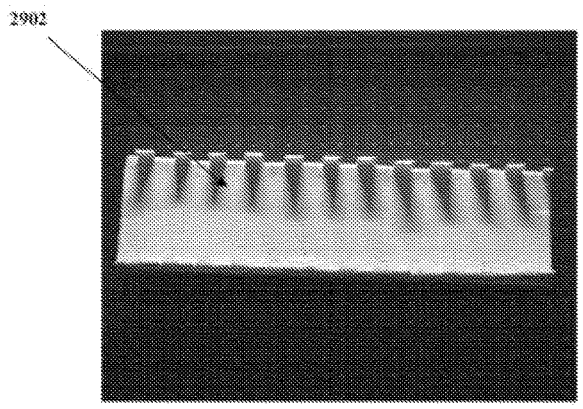
Figure 30:
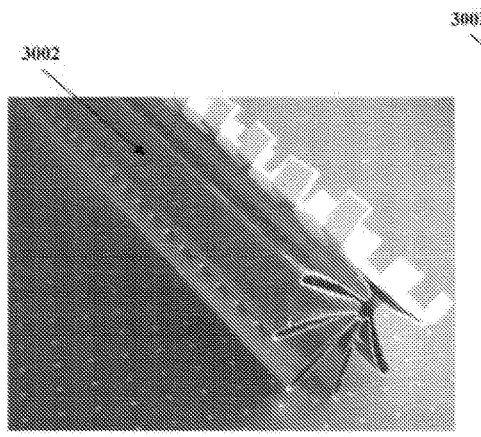
Figure 31:
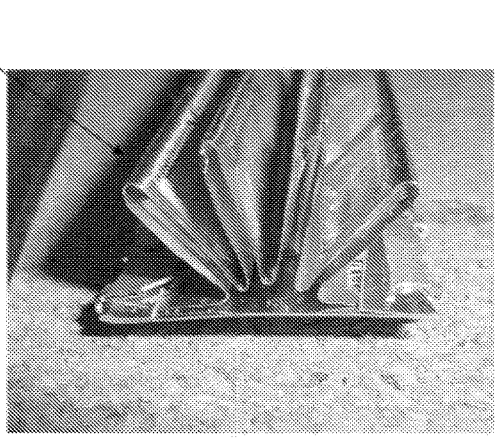

Referring to FIGS. 28-29, we see a single strand LED chain 1202 which in one embodiment we mount to a mechanical strip 2802 with a series of openings that match those of the string 902. The strip acts as both a mechanical holder, and a heat transfer device for the LED packages.

When used in a T-5 or T-8 fluorescent bulb replacement fixture, the ends of the strip 2802 are bent (in one embodiment as an 'S', 'Z', or any other "spring" form 3002, in order to form a compression spring insert, so that when the strip 2802 is slid within the housing of said tube 2704 it forms a constant and efficient metal-to-metal heat transfer medium to the housing, which acts here as the heat sink. Note that in effect, as mentioned before, the strip 2802, the spring 3402 and insert legs 3404 act themselves as radiators.

When using open-emitter LEDs, it becomes necessary to electrically insulate the bottom of the LED package 904 making contact with the heat sink 3002. One solution would be the addition of a simple FR4 sheet or other electrical insulator 'sandwiched' between the bottom of the LED and the heat sink. The different heat transfer rates would be accounted for by the sliding, as there would be no wave solder joints at the LED to crack.

In another solution, as discussed in Zykin (U.S. patent application Ser. No. 13/313,129) and incorporate herein in its entirety trough reference, a base 2902 incorporating a layer of a material such as CERATOM 912 could be used. Acting as an efficient heat conducting dielectric, this would ensure efficient heat transfer to the heat sink 3002 and any fins or radiators attached thereto.

Figure 32:
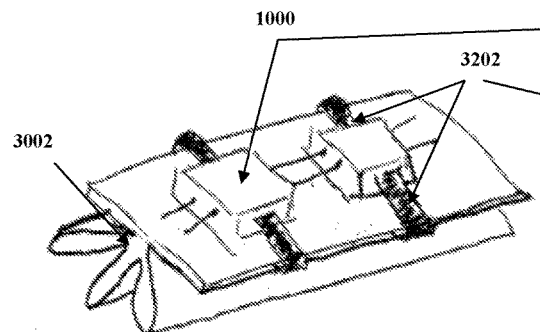
Figure 33:
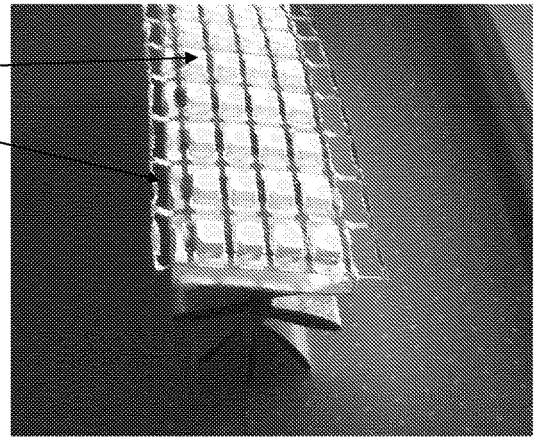

In another embodiment FIGS. 32-33, the LED matrix or grid is held above the heat sink, using only the edge 3202 connections to transfer the heat, resulting in an inexpensive, non-PCB solution. In all cases, the complete lighting package may be immersed in a cooling fluid, which may be a dielectric to preserve electrical integrity while providing cooling. This may include inert gases.

Figure 34:
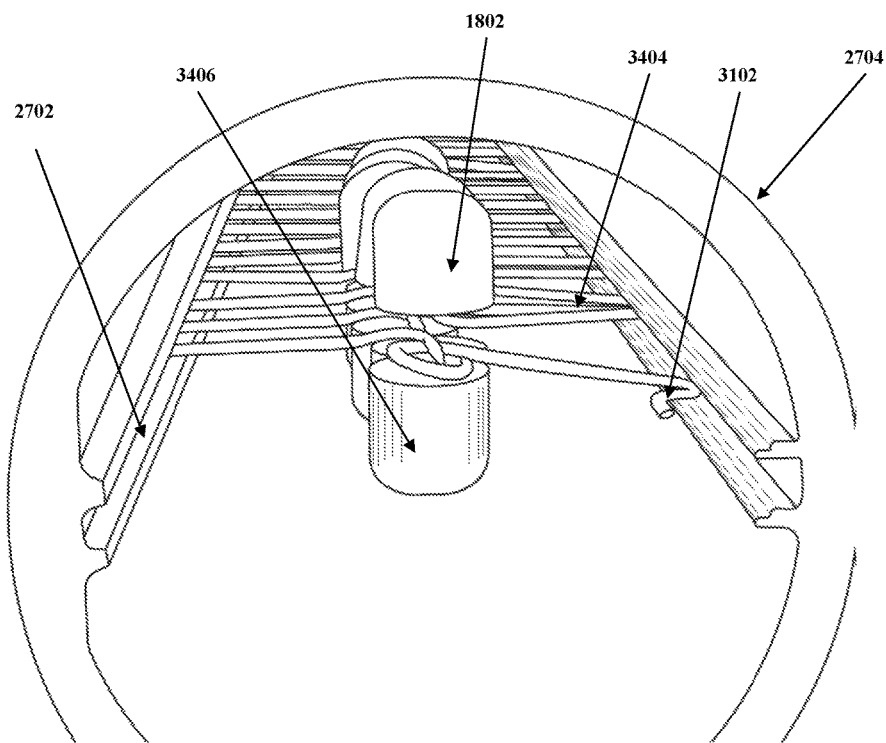

Referring to FIG. 34 we see an alternate embodiment where two or more LED strips 1802 are placed one over the other (forming a bottom LED strips 3406, in one embodiment with lensed LEDs, although in an alternate embodiment they may not need the lensing), the strips of LEDs may then be inserted into a suitably modified T-5, T-8 or other suitable enclosure tube 2704. Said enclosure tube may have the aforementioned slots 2702 or be smooth and have the leads 3402 from the LED strips 1802 bent so they extend outside of the strips without significantly occluding the light emitted from the LEDs. Thus in addition to serving as a thermal radiator, they mechanically support the LED strips 1802 within the enclosure tube 2704.

Figure 35:
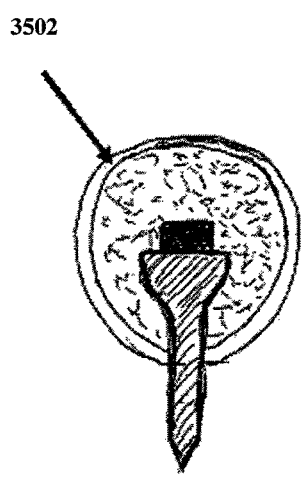
Figure 36:
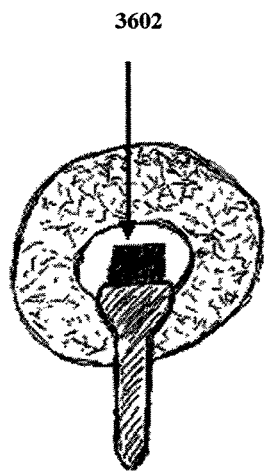
Figure 37:
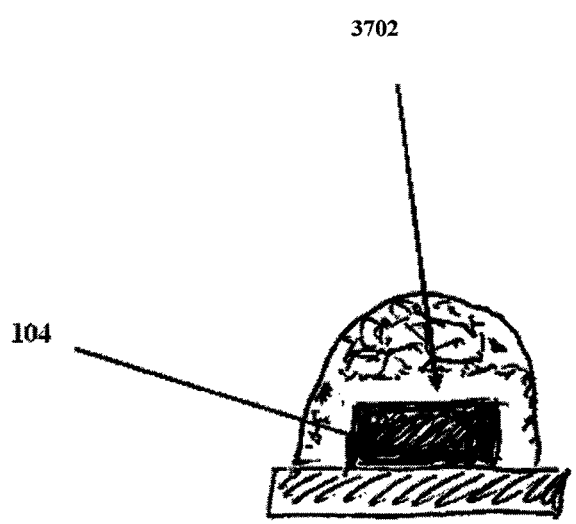
Figure 38:
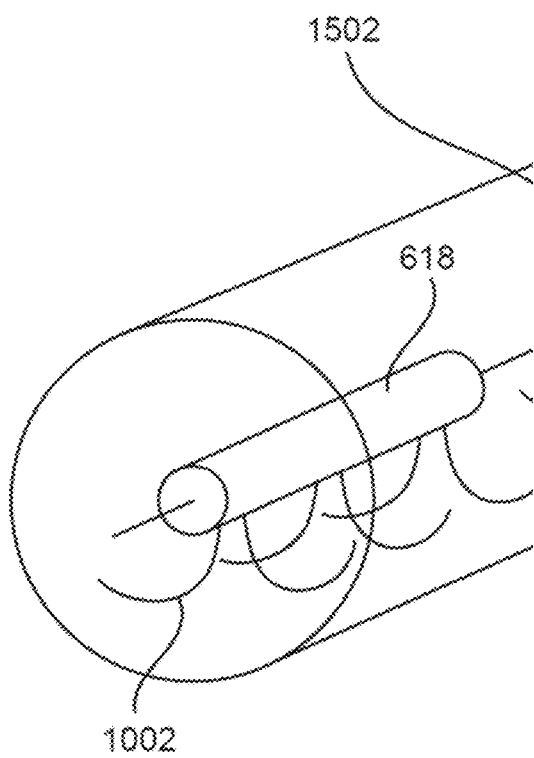
Figure 39:
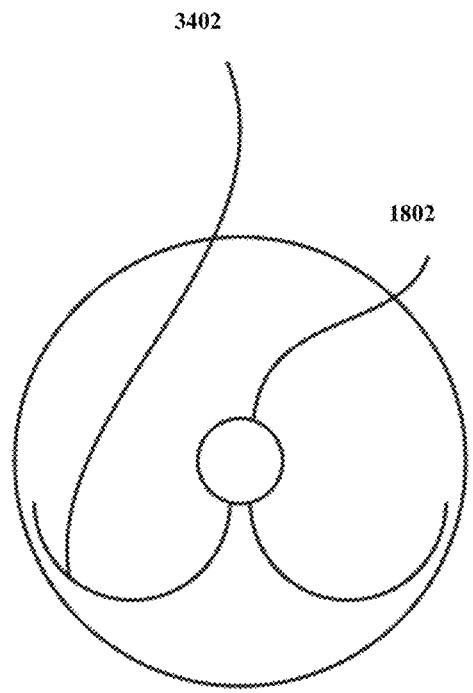
Figure 40:
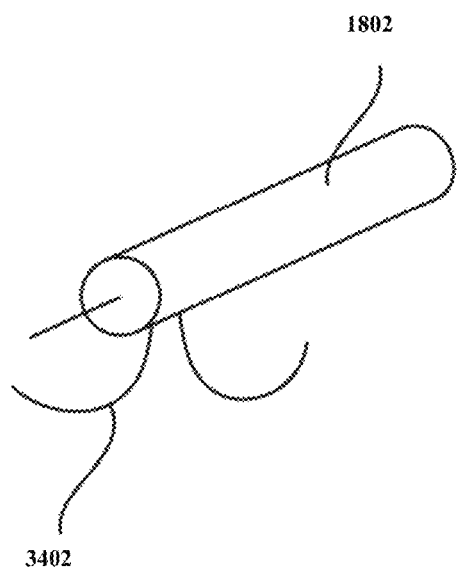
Figure 41:
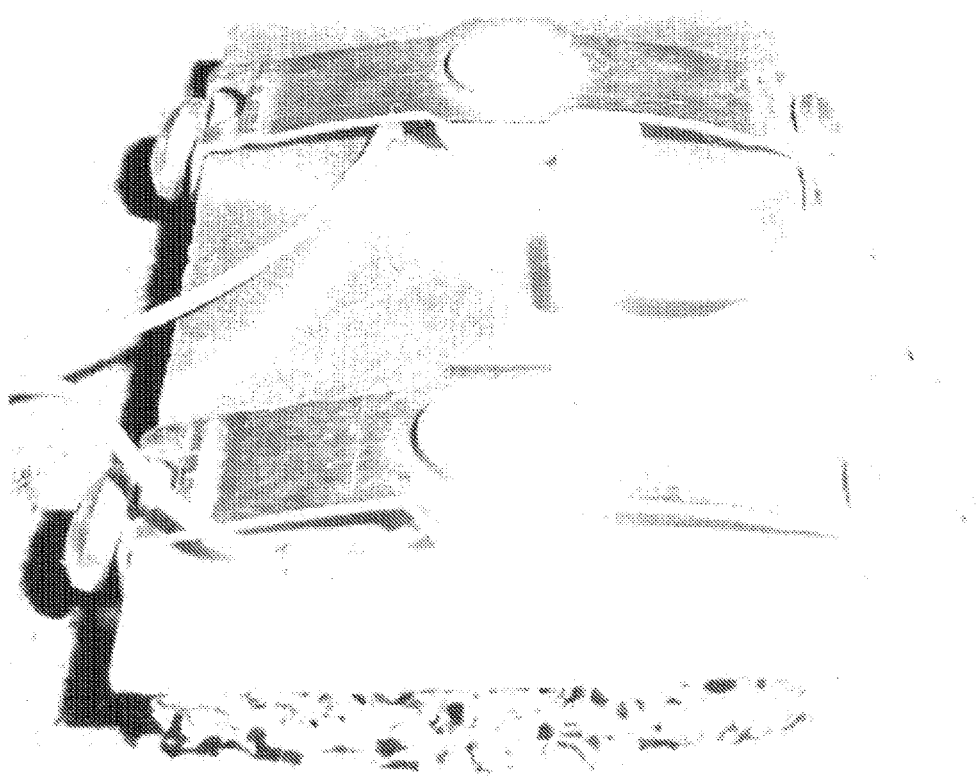
Figure 42:
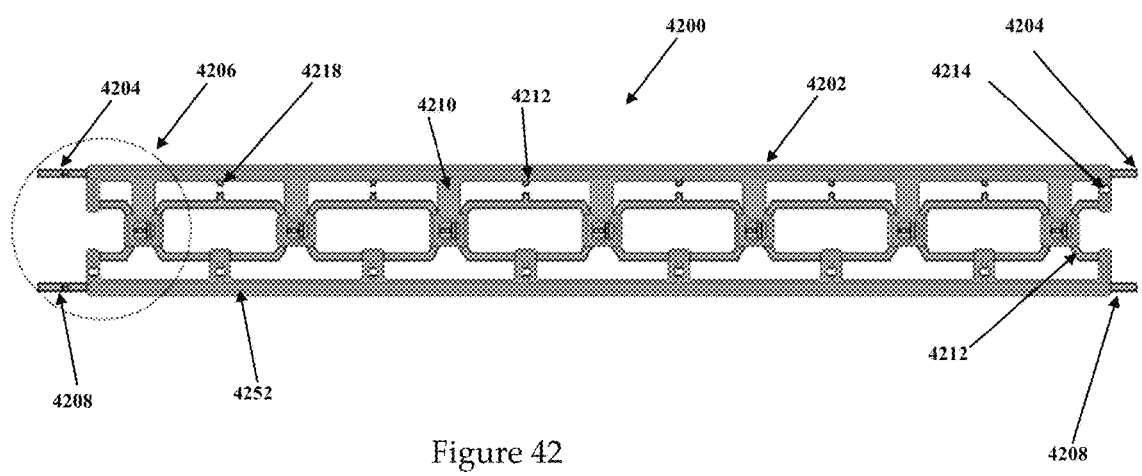
FIGS. 42-78 show illustrations of improved LED mounting system based on a preformed clip mount.
Figure 43:
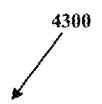
Figure 44:
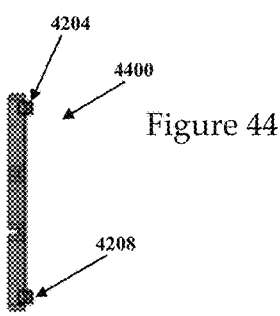
Figure 45:
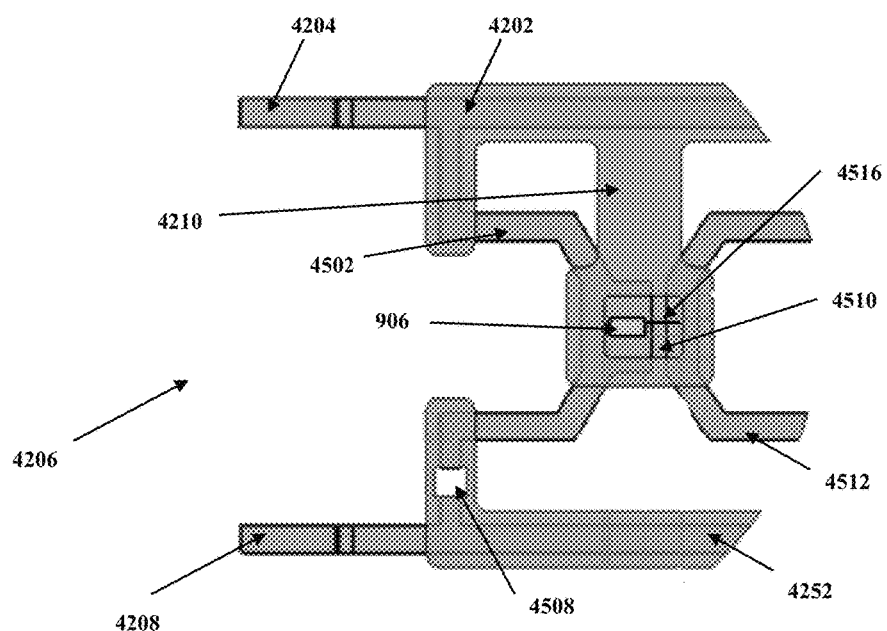
Figure 46:
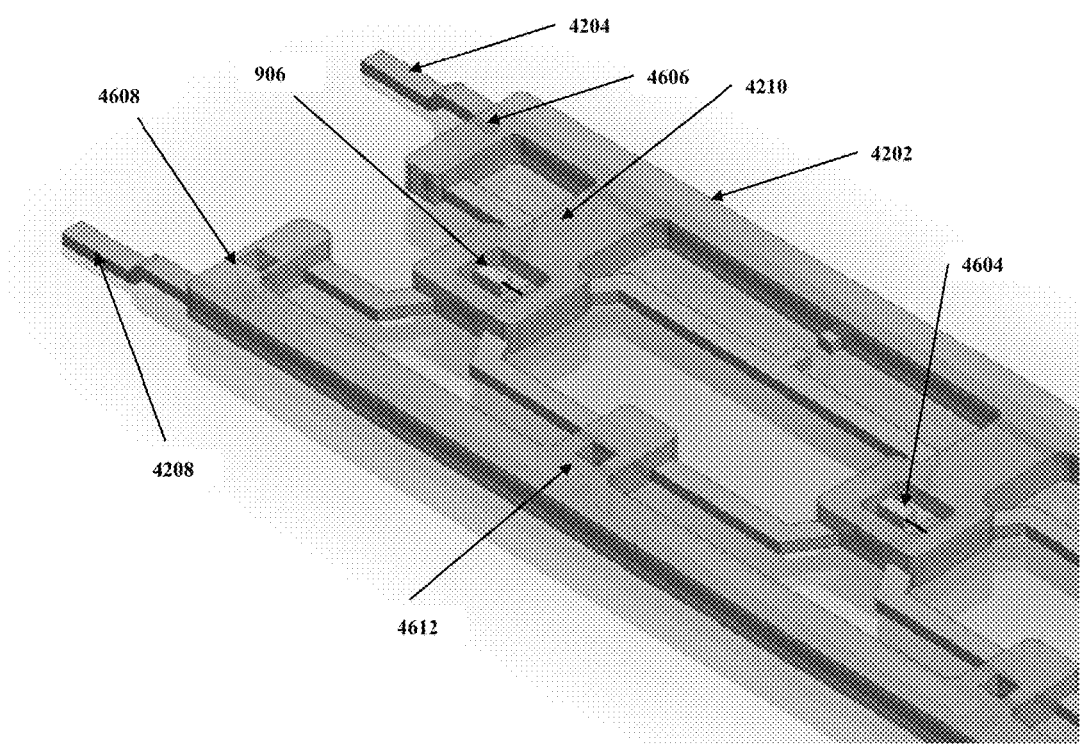
Figure 47:
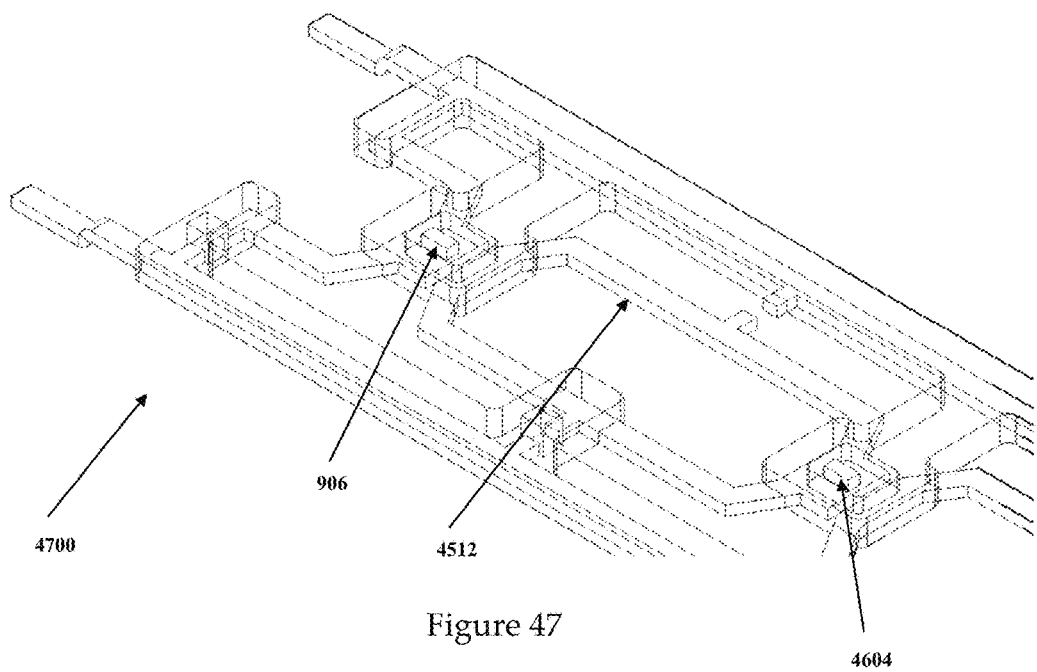
Figure 48:
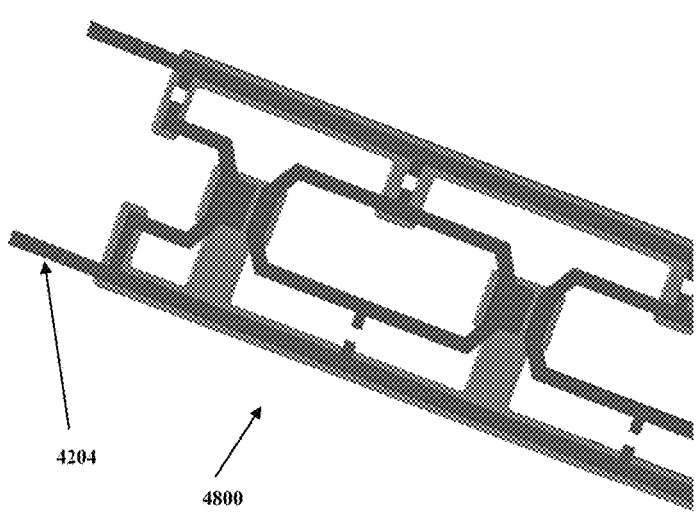
Figure 49:
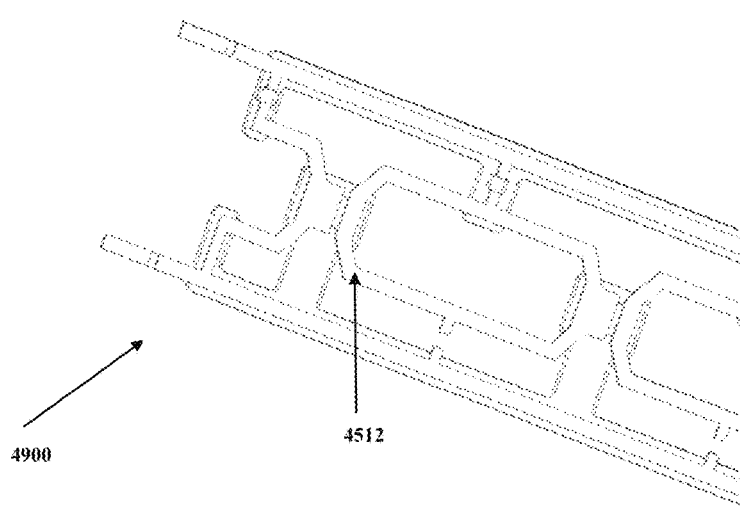
Figure 50:
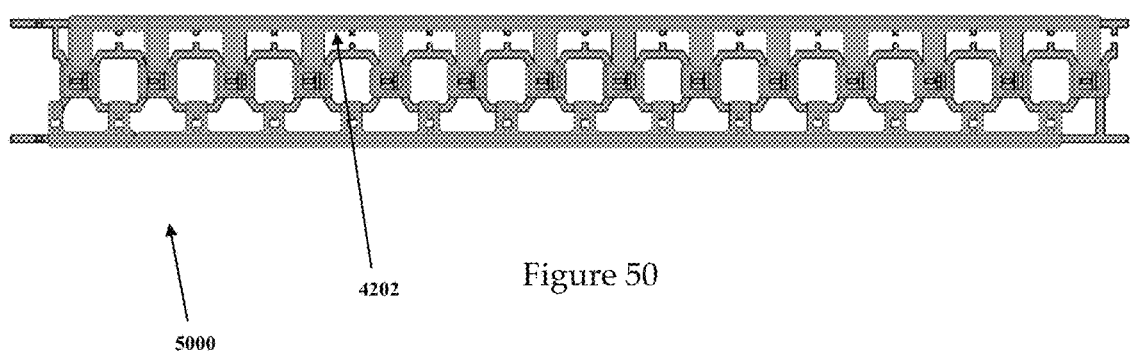
Figure 51:
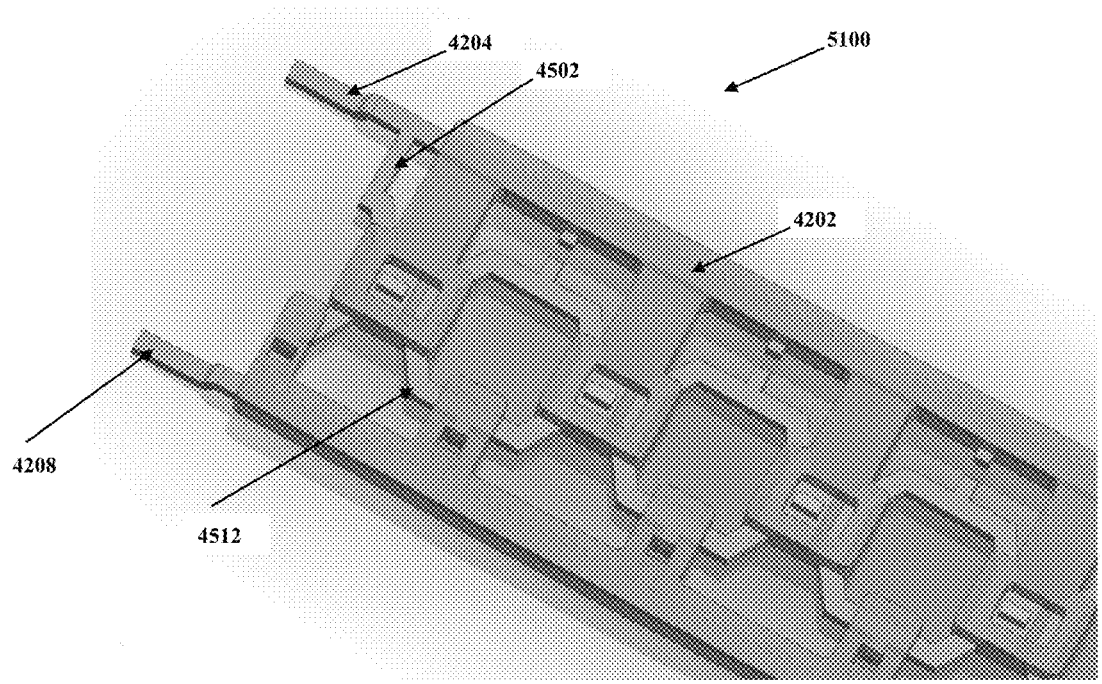
Figure 52:
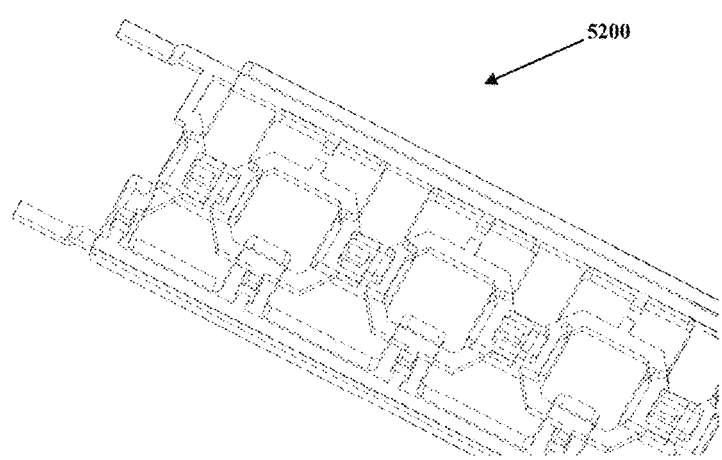
Figure 53:
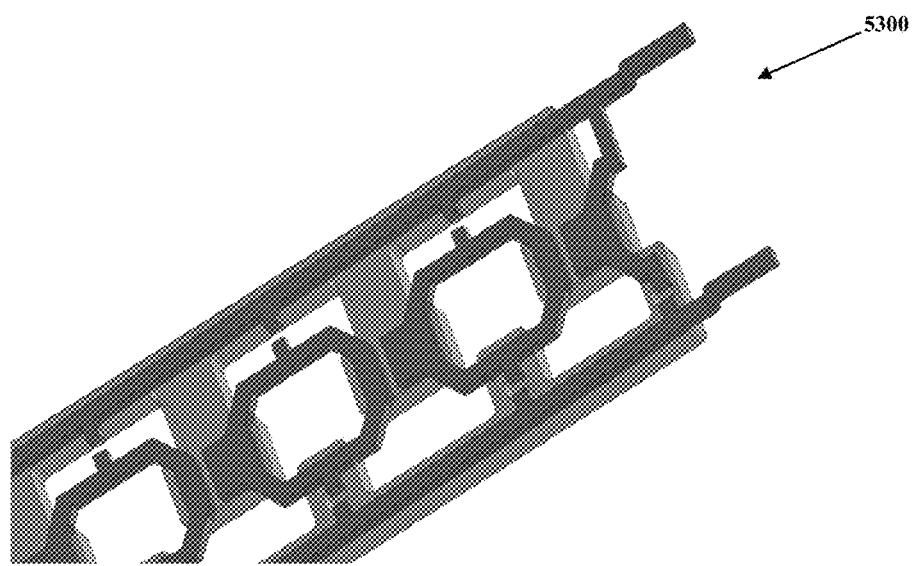
Figure 54:
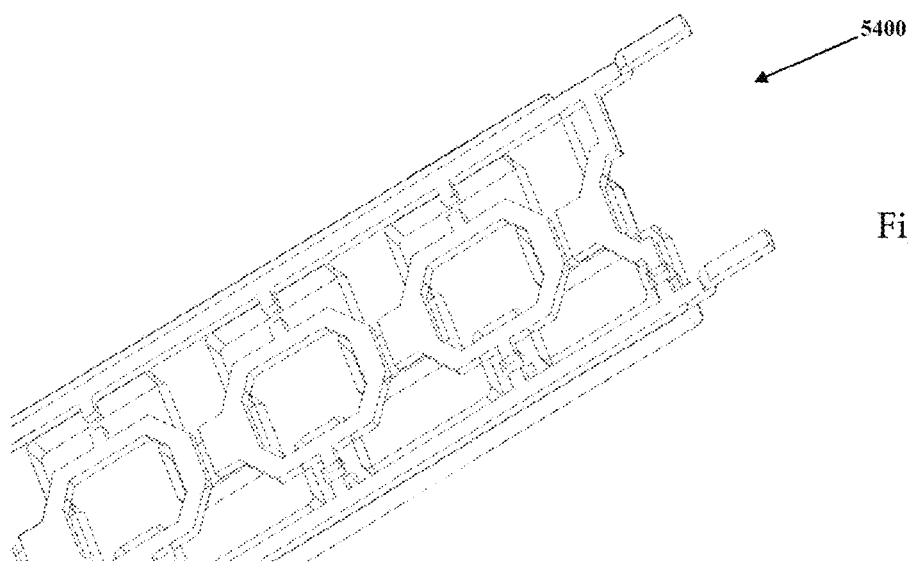
Figure 55:
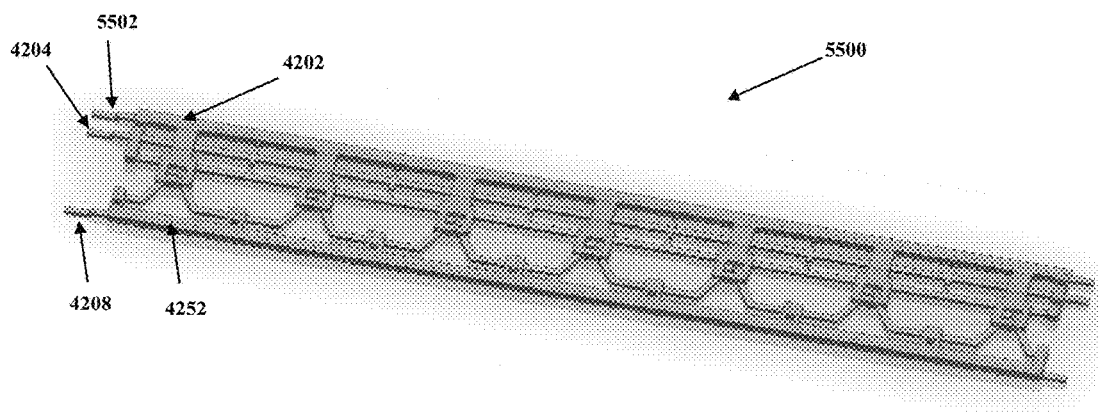
Figure 56:
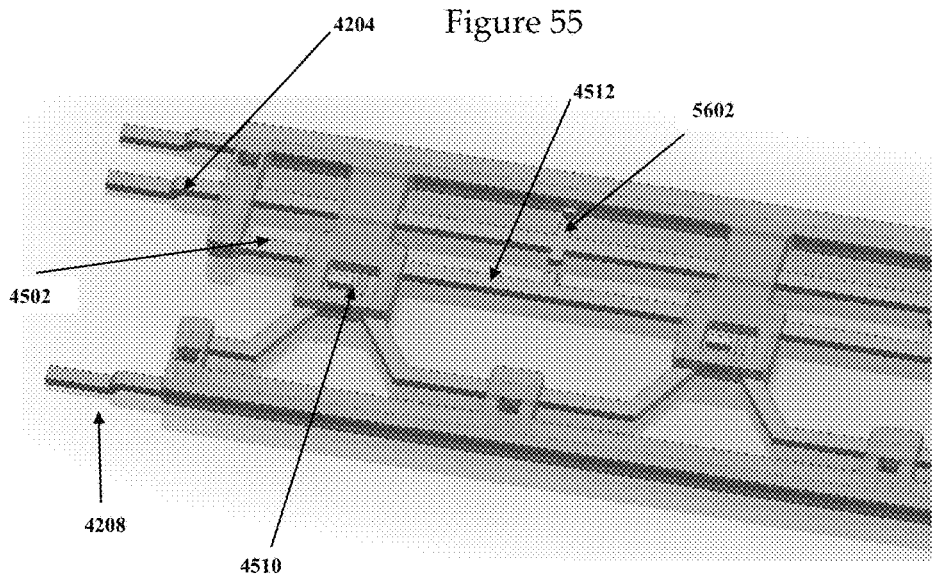
Figure 57:
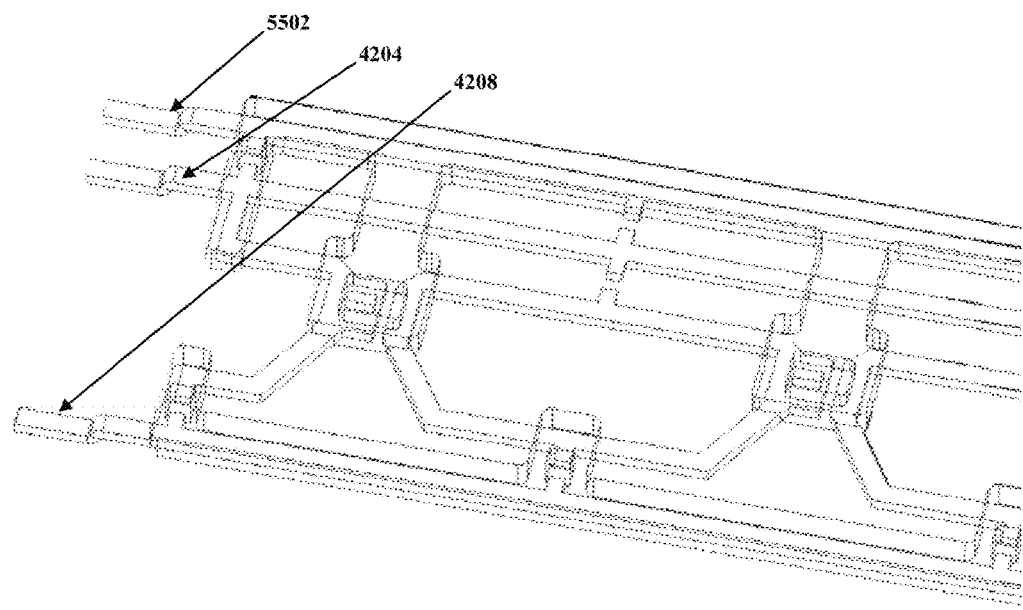
Figure 58:
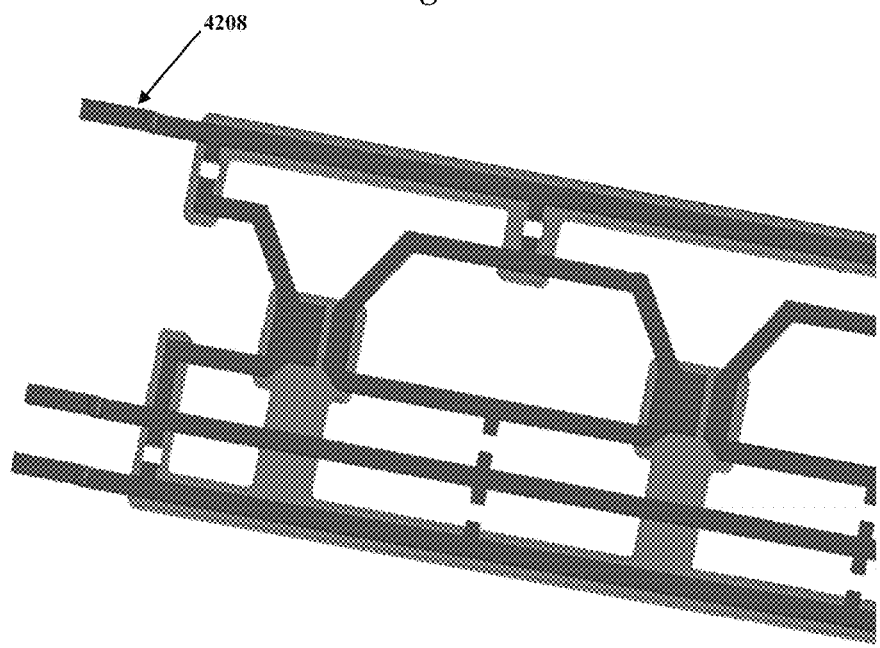
Figure 59:
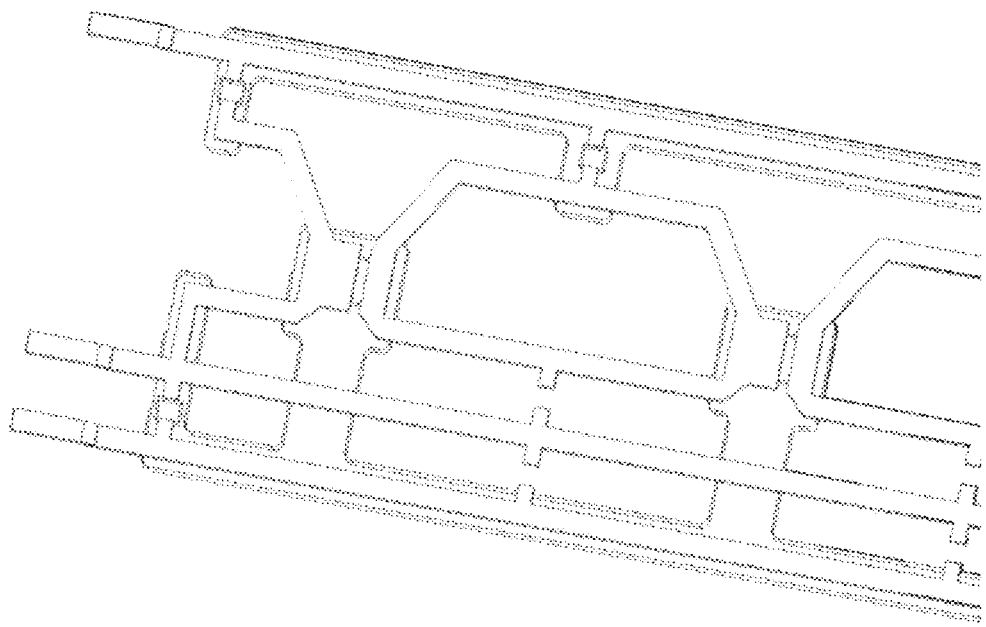

Referring to FIGS. 35-37, the coating of yellowing phosphor described above may be applied near the periphery of the encapsulation 3502, above the actual LED die area 3602 or directly above the LED die on a traditional package 3702.

Referring to FIGS. 42-64 we see an embodiment 4200, 4300, 4400 that instead of using a plurality of LED individual packages 102, is instead embodied by one or more wireframe holders or molded structures 4202, 4252. In one embodiment being a single molded structure, in another formed in two or more parts, in one embodiment being a first molded structure 4202, and a second molded structure 4252 portions. These structures are designed to mechanically hold two or more electrical conducting metal bars or wireframes comprised of two or more bars.

In one embodiment 4200, they are comprised of a first bar 4204, and a second bar 4208 portions) that are separate and significantly parallel to each other. When the one or more structures 4202, 4502 hold them, this creates an LED light source assembly that is a composite structure 4200 that allows for the easy placement of the LED chips 906 on the metal base within a mechanical/electrical location and then holds the LED chip 906 at a known location within said composite molded structure 4200.

This allows for the LED chips 906 to be left open faced (within an opening 4602 on said first molded structure 4202), or perfectly distanced from optional lenses/covers mounted over said opening 4602. As shown, the top view shows structure 4200, its side view 4300 and its end view 4400 illustrates the simple arrangement.

Figure 71:
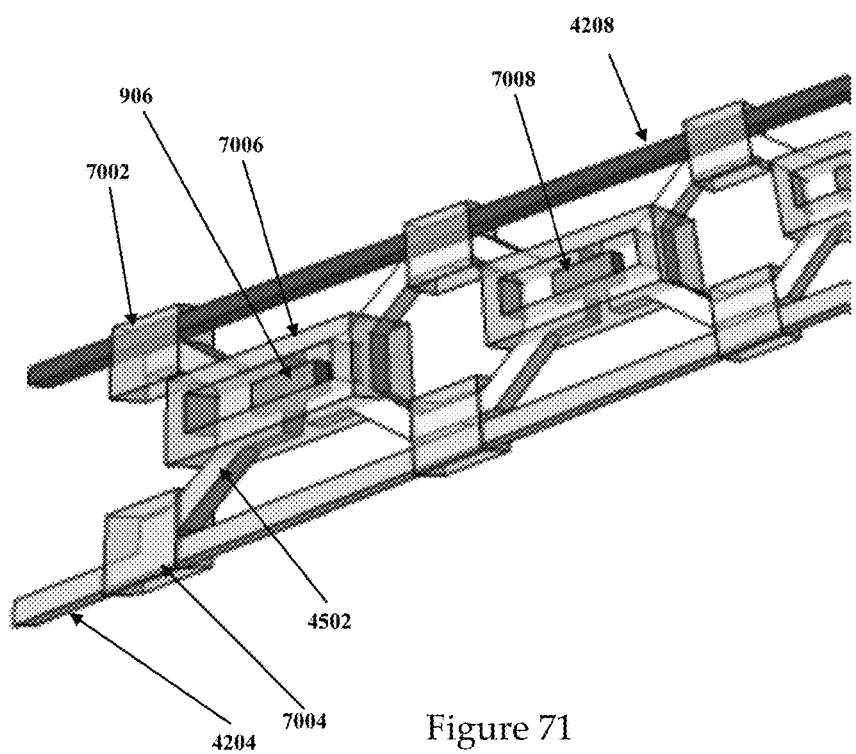
Figure 72:
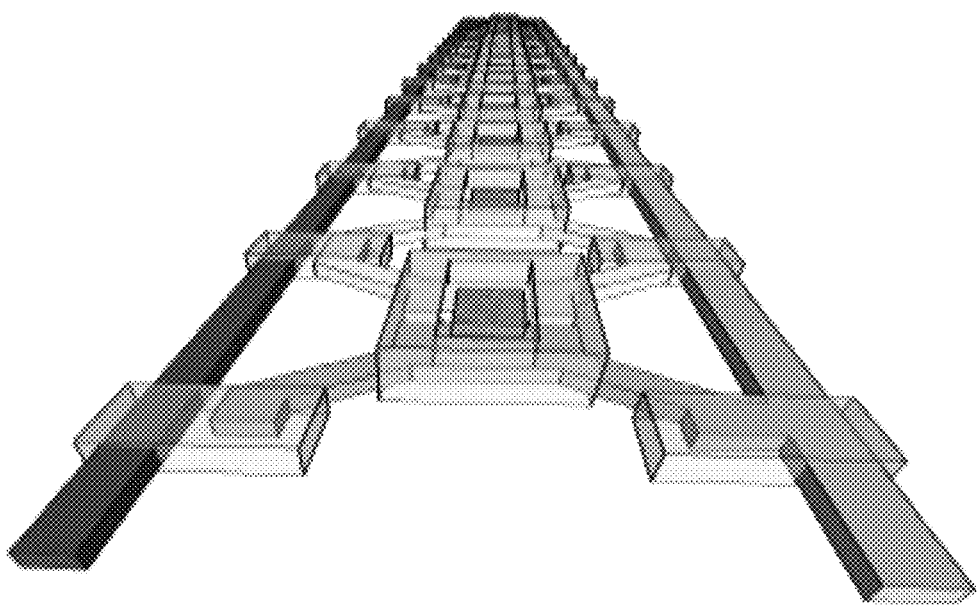
Figure 73:
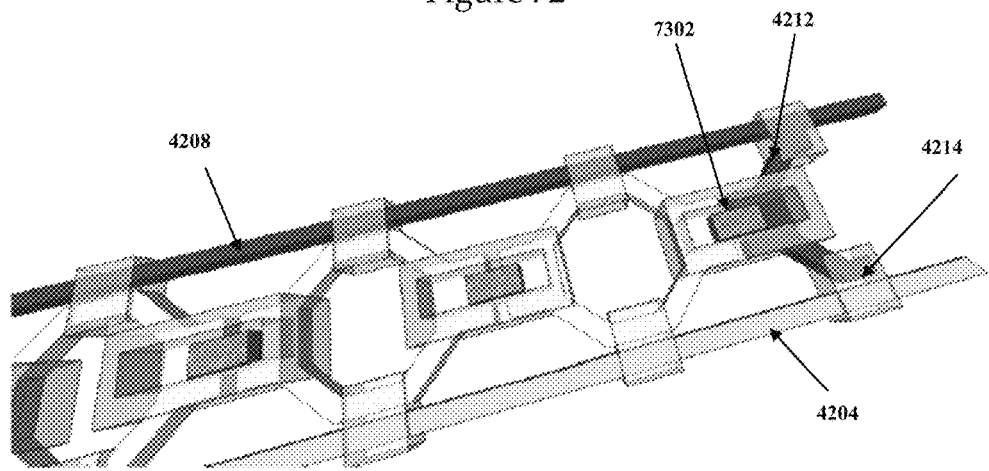

In one embodiment, the two power distribution bars 4204, 4208 go across the composite structure 4200. A voltage difference having a DC component may be applied across these bars 4204, 4208, so that a current component crosses the LED chips 906. As seen in the detail 4206, the first electrical connection of the first bar 4204 is passed to the LED chip 906 via a first power bar branch 4502 that forms the base on which the LED chip 906 is mounted. Said first branch 4502 is extended (in effect, 4502 and 4506 form a truncated cascade power bar which we see in complete form in 4512), but not connected to the second bar 4208 by leaving a gap 4504, which prevents a short the circuit. It is however, optionally clipped onto the molded structure 4202, 4252 at one or more points, including point around 4504 where said second structure 4252 holds the first branch 4502 from touching the second 4208 bars to said structures 4202, 4252 to form the composite structure 4200. Of course, the LED chip 906 must be connected to the first 4204 and second 4208 power bars by either wire bonding 4516 the LED chip 906 across the LED pad gap 4510 or flip chip as seen in FIG. 71.

One or more individual LED chips 906 may be placed on said opening 4602 and electrically connected to the current carrying frames 4204, 4208 so that the cascading chain of two or more LED chips 906 allows for one or more chain of cascading LED chips 906 forming a strip (as shown in 4200 one of seven LED chips 906). These chains may have seven 4200, fourteen 5000 or any other suitable number.

In one embodiment, a wire bond 4516, flip chip 7106 or similar electrical connection is used to connect the LED chip 906 to from the first branch 4503 formed LED pad across the gap 4510 to the cascade branch 4512 that forms the second and subsequent links in the LED chain. Such a connection is accomplished at location 4510, where the LED chip 906 connects to the cascade power bar 4512 which brings the current and voltage to the next LED chip 4604, where the same wire or wire bond connects to the next cascade power bar 4512, etc.

The wire frame drawing top view 4700 and bottom view 4800 illustrates clearly the connections. At the end of each chain of two or more LED chips 906 connected in cascade via the cascade power bar 4512, the cascade power bar 4512 is truncated to form a final branch 4212. Said final branch 4212 forms the receiving LED pad for the final LED chip 906 in the chain, is connected at one end to the second power bar 4508 and at the other has a gap 4214 to ensure that no electrical contact is made with said first bar 4204.

Said first and second power bars 4204, 4208, first and last branches 4502, 4212 and the intermediate cascade bars 4512 forming the links in said cascading LED chain, are all held in position in space by extensions of the one or more molded structures 4202, 4252, including the LED holder structure 4210 extension and first branch 4502 holder, as well as the cascade branch holder extension 4612. Note that in one embodiment said structures 4606, 4608, 4210, 4612 may alternate and extend from the second and first 4202, 4252 structures alternatively.

The assembly holder, connector or molded structures 4202, 4252 may be formed of an insulative material such as a desirable resin, so that at the points where it needs to secure the various power bars it simply clips on through pressure, as illustrated for example around point 4508, where it secures the free end of the first branch 4502, as well as the clipped portion of the second bar 4208 and said second bar itself.

In one embodiment, the molded structure may be made of plastic, both an insulating and/or an electrically conductive plastic. In an alternate embodiment, it is possible to use a polycarbonate. Polycarbonates (PC), known by the trademarked names Lean, Maroon, Marcela and others, are a particular group of thermoplastic polymers. These are easily worked, molded, and thermoformed. Because of these properties, polycarbonates find many applications. Polycarbonates do not have a unique resin identification code.

In an alternate embodiment, it is possible to use a polycarbonate. Polycarbonates (PC), known by the trademarked names Lean, Maroon, Marcela and others, are a particular group of thermoplastic polymers. They are easily worked, molded, and thermoformed. Because of these properties, polycarbonates find many applications. Polycarbonates do not have a unique resin identification code.

The molds or holders 4202, 4252, 7002, 7004, 7006 and others may be formed via thermal molding (where two pieces are melted together to hold the power bar or strip within it), mechanical (where a snap-on or other clip form of matched structure holds the strip within it), chemically (glued together) and other embodiments. The mold may be one or more forms.

As seen in FIGS. 42-69, we see embodiments with two major molds, and upper and lower. Referring to FIGS. 70-73, we see an embodiment where a plurality of molds holding the upper and lower strips at a fixed distance from the cascade power bars and other internal power strips.

In an alternate embodiment, the first bar 4204, second bar 4208, first 4502 and final branch 4212 and in between cascade bars 4512 are held by one or more of said molds 4202, 4252, 7002, 7004, 7006. Besides clipping, said molds may be formed by snap-on, screw-in, chemical bond, etc. Besides saving holders 4202, 4252 material, leaving portions exposed both above 4700 and below 4800 aids in the cooling of the frame 4200.

As can be appreciated, however, the possible embodiments include a holder 4200 that includes integral terminals (either formed directly on the surface of the holder or insert molded into the holder). One benefit would be a composite frame 4200 configured so as to include an integral connector system that is configured to mate with another composite frame 4200. One or more strips 4200, 7000 may then be inserted into a tube forming the strip 1802 that goes into the tube.

It should be noted that in certain applications the molded holder 4200 may be formed of a resin that is transparent, or of a suitable color so as to facilitate the light emitted from the complete assembly to be in a particular spectrum for a specific LED die.

When looking at other embodiments, the denser 14 LED chip 906 package see in FIGS. 50-54 illustrates a denser approach. As seen in 5000, 5100, 5200, 5300 and 5400 the composite package 5000 formed by the mold portion 4202 gripping the various metal bars 4204, 4204, 4502, 4506 allows for a sturdy arrangement.

In an alternate embodiment, the power bars are offset FIGS. 55-64 so that the composite frame 5500 is formed by a first and second molded forms 4202, 4252, and the wiring is comprised of an upper conduit or bar 5502, a first 4204 and second 4208 power bars, plus a cross member bar 5502, which is used to balance any power supplies. In a T8 or similar fluorescent replacement system, the LED power supply may be located at one end, the voltage rectifier at another, and said cross member bar 5502 may be used to link them in combination with the first 4204 and second 4208 power bars.

Figure 60:
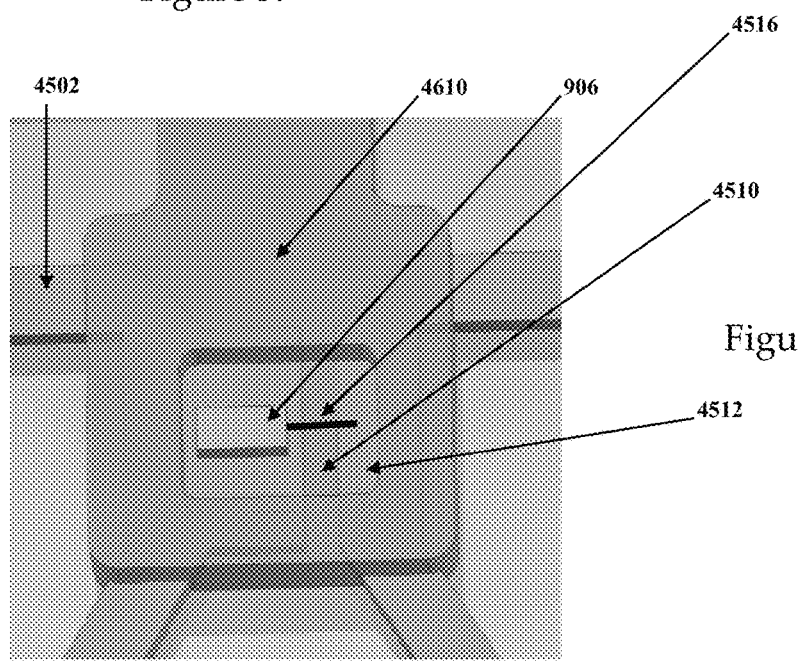
Figure 61:
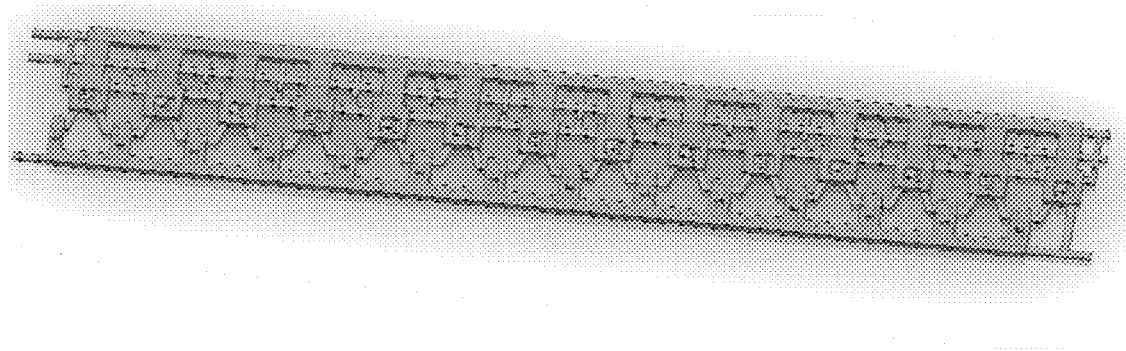
Figure 62:
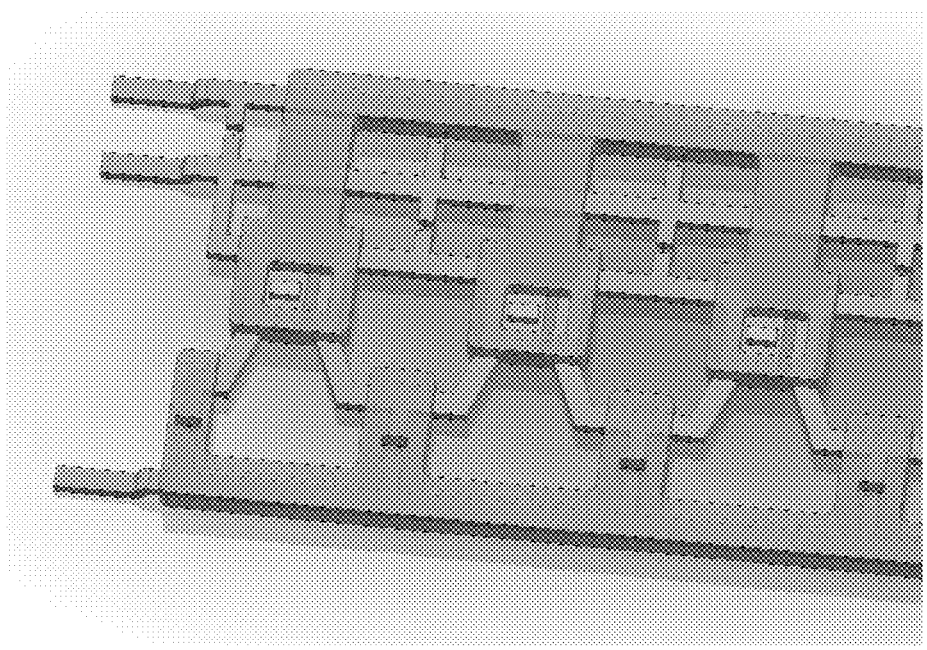
Figure 63:
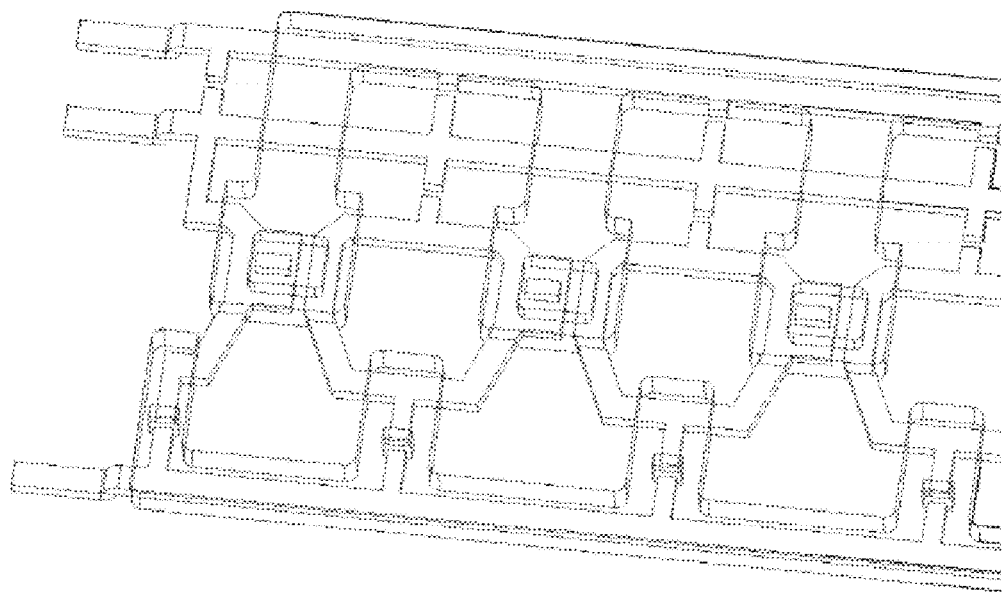
Figure 64:
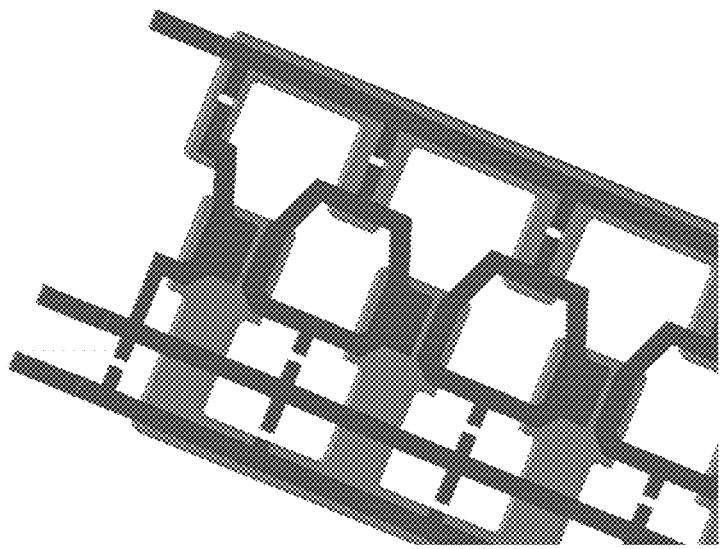

In one embodiment, the holder 4202 holds the cross bar 5502, power bar 4204, first branch bar 4502 and cascade bars at gap 4510 areas, and the second mold holds the second bar 4204 and middle portion of the cascade bar 4512. FIG. 60 illustrates details of the structures around the LED chip 906. It is important to note the value of the cutoffs 5602 of the various bars. By closing or opening these portions of the circuits, the LED chains could be shortened, lengthened, repaired and/or otherwise controlled.

Figure 65:
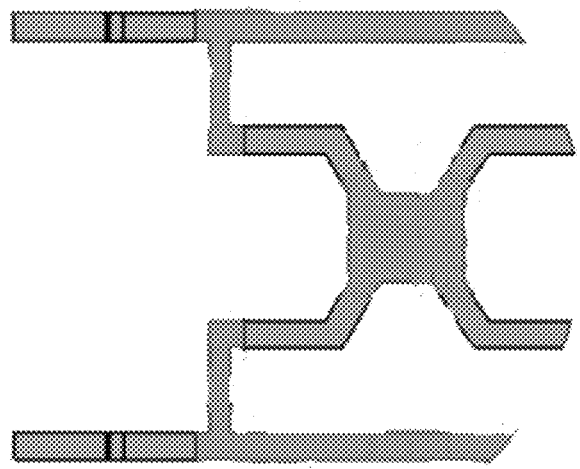
Figure 66:
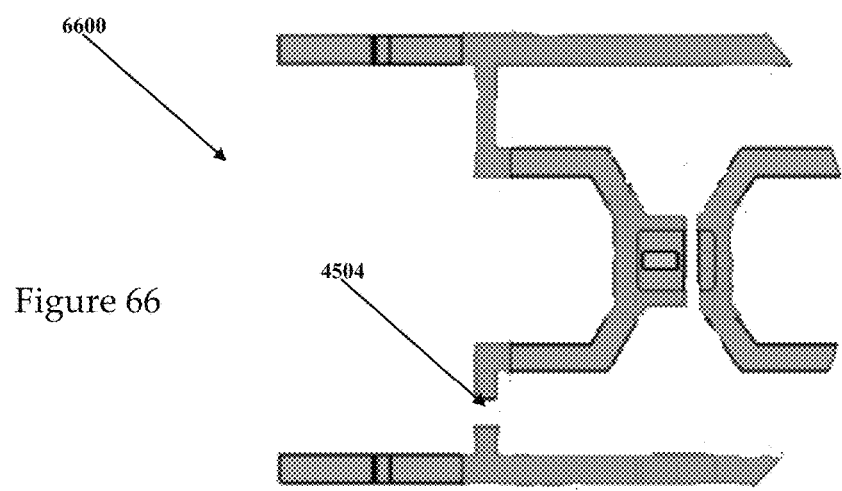

The advantages of the above during a manufacturing process are obvious to one skilled in the art. Referring to FIGS. 65-66, we begin an embodiment where the complete rectangular frame of metal is stamped to eliminate excess material but the bars 6600, the LED chip is mounted, and then the final cuts to the frame are made (along the bottom, creating the 4504 gap and/or 4214 gap), the top 4212 gap and the gap across the LED mounting pad 4510. The wire bond is then made to connect the LED chip 906 to the cascade 4512 LED pad portion, or the flip chip, etc.

In an alternate embodiment 6600, the frame is stamped, at the same time creating the appropriate gaps, the LED chip 906 is mounted (using standard wire mounting and bonding techniques, be they eutectic or non-eutectic) then the LED chip 906 is wire bonded to the cascade frame 4512. All that remains is snapping the frames 4202, 4252 over the bar assemblies 6502 or 6602, conversely the molds/frames 4202, 4252 are snapped and then the frame gaps created.

Figure 67:
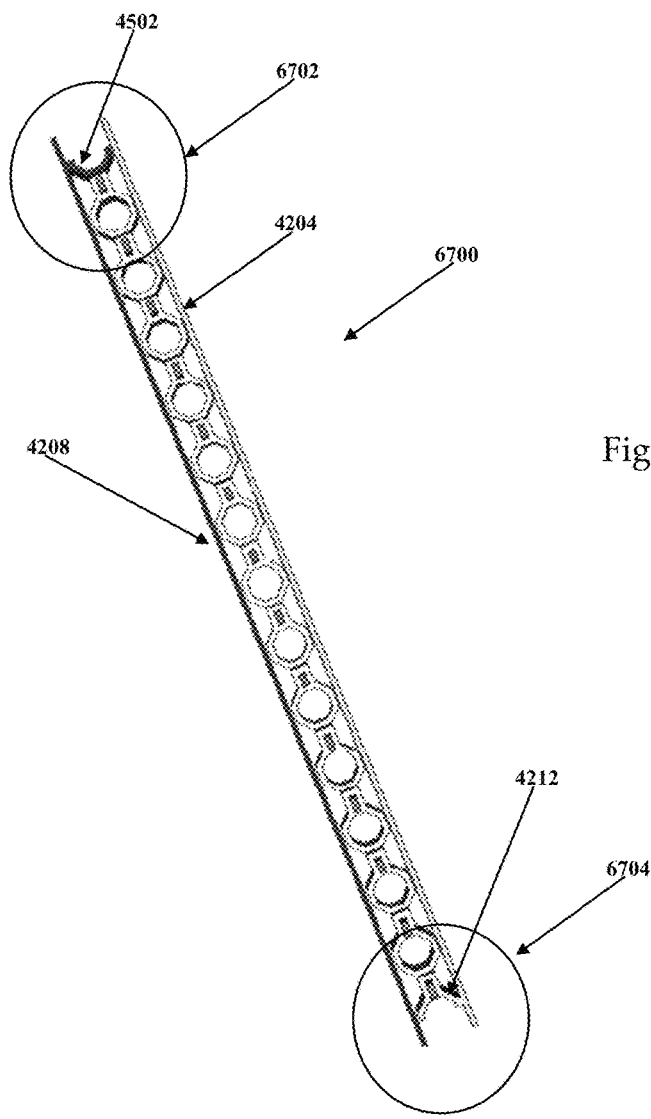
Figure 68:
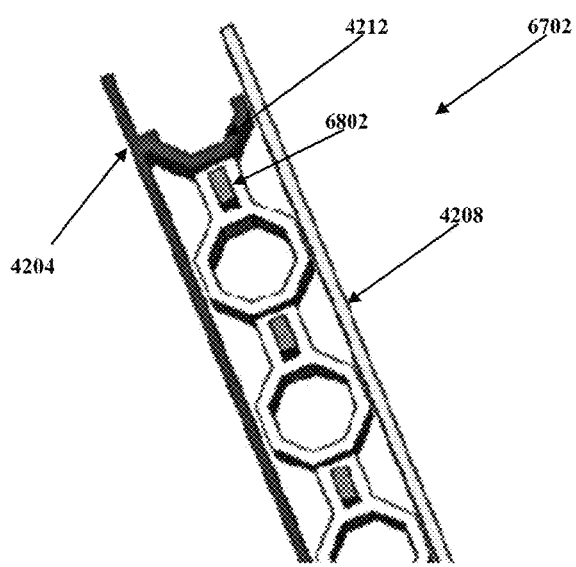
Figure 69:
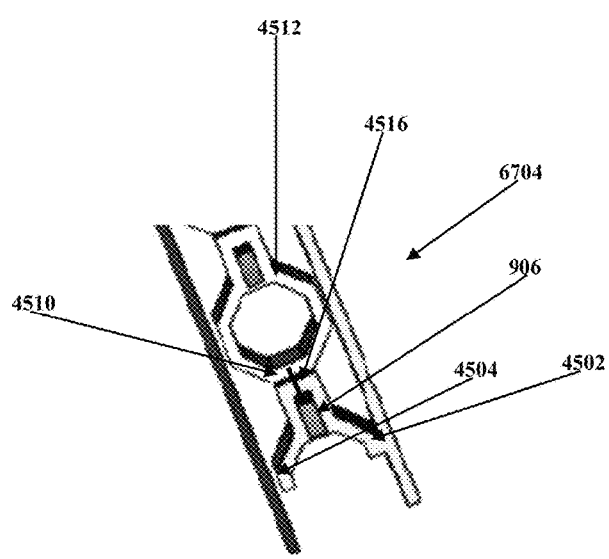
Figure 70:
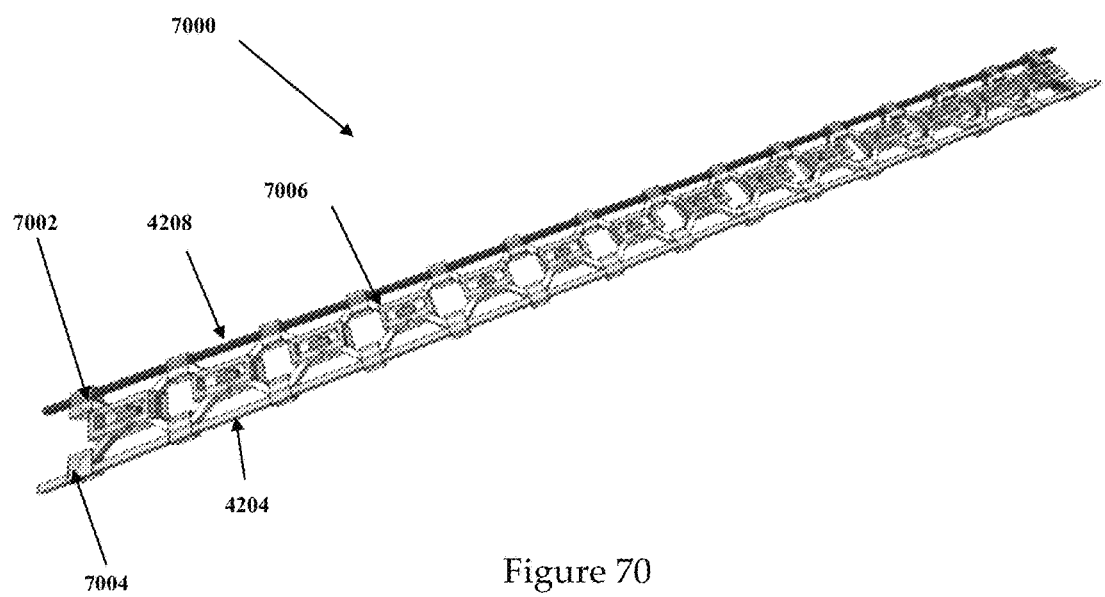

Referring to FIGS. 67-69 we see an alternate embodiment of the composite frame's metal strip configuration, ideally suited for insertion within a tube (FIG. 34), where the two or more LED strip 6700 form a chain of one or more strips 1802 designed for insertion within the side rails 2702, with the first bar 4204 carrying one side of the power (say the positive voltage) and the other 4208 carrying the ground or other selected voltage.

As seen in the close ups of the ends 6702, 6704, we see how the first branch 4502 connects the power coming from the first rail 4204 and forms the first LED pad having the first LED 906 (the other portion of the LED 906 is connected to the other part of the pad across the gap 4510 with the wire bond 4516) thus forming the first cascade branch 4512 from where the other LED chips are sequentially chained until reaching the final LED chip 6802 which is wire bonded across to the final link 4212 which goes to the second rail or bar 4208, with of course the other of said final branch 4212 having a gap so it does not short circuit with the first rail 4202.

Note in one embodiment, the above may be inserted directly into the rails 2702. In an alternate embodiment, a similar single body or dual body overmold or holder plastic structure may be placed over the shown rails.

Referring to FIGS. 70-73, we see an embodiment where a simple arrangement occurs when the first bar 4204 and the second bar 4208 go across the structure, bringing power to the assembly. The first bar 4204 has a first branch bar 4502 which forms all or part of the first LED pad where part of a flip chip LED 906 is mounted (may also be the first part with a wire bond going across) and goes across the structure to the second part of the pad which is part of the cascade bar 4512 across the gap 4510. The first branch bar 4502 goes across the gap 4510 between first and second bars (4204, 4208) but does not touch the second bar, leaving a gap 4504 which ensures it does not touch the second bar 4208.

The LED chip 906 is connected across the pad gap 4510 through a number of embodiments. In one, as before, a wire bond 4516 is used to connect the LED chip 906 from one pad 4502 to the cascade bar 4512. In another, a flip chip may be used to attach the relevant portions of the LED chip 906 from one pad across the gap 4510.

As before, an LED chain is created with two or more LED chips 906 when the first branch 4502 mounted LED chip 906 spans the gap 4510 (again via a wire bond, flip chip or similar arrangement), and passes the remaining power to the second LED chip in the chain 7008, and so forth until the final LED chip 7302 whose wire bond/flip chip end is connected to the final LED pad portion, which is part of the final branch 4212 and is connected at one end to the second bar 4208 and has a gap 4214 at the other end separating it from the first bar 4204.

Whereas before the various bars 4204, 4208 and branches 4502, 4212, 4512 among others, need to be kept separate from each other for electrical reasons across the critical gaps, as well as against excessive bending (such across the LED pad portions formed with parts of the branches 4502, 4512. The above is handled through one or more molded components. As stated before, said molds may be thermally, mechanically, chemically or otherwise formed to ensure the upper and/or lower portions of said mold structure hold the bars, branches and pads within acceptable location tolerances. Such may be the case of branch molds 7002, 7004 which hold the branches separate and fixated with relation to each other, and the pad mold 7006.

The above composite LED chain 7000, may then be connected to others (either in series 1802 or in parallel 1902) and inserted within a tube 2600 and/or 2700, or bent to make an assembly suitable for a bulb 2400 and/or 2500. Note that when making them for a bulb, the LED chains 1902 may be folded at the top and bottom to make a chandelier 2400.

Figure 74:
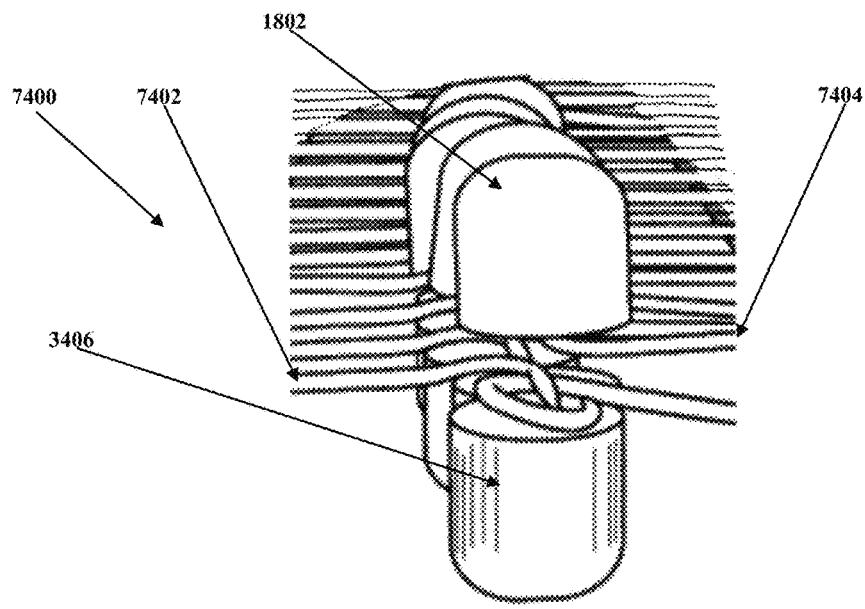
Figure 75:
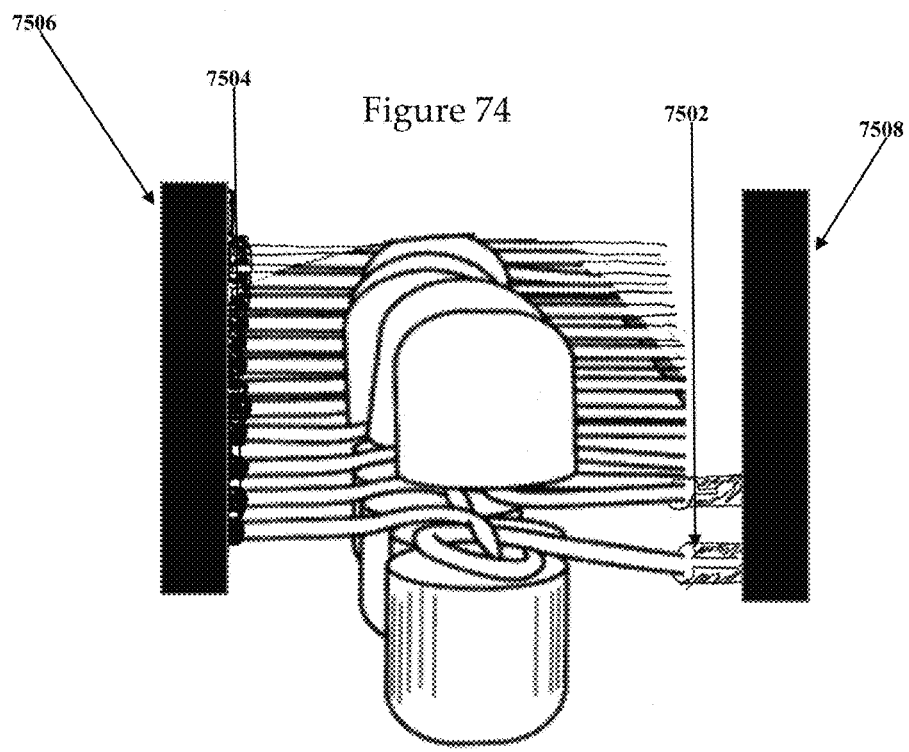
Figure 76:
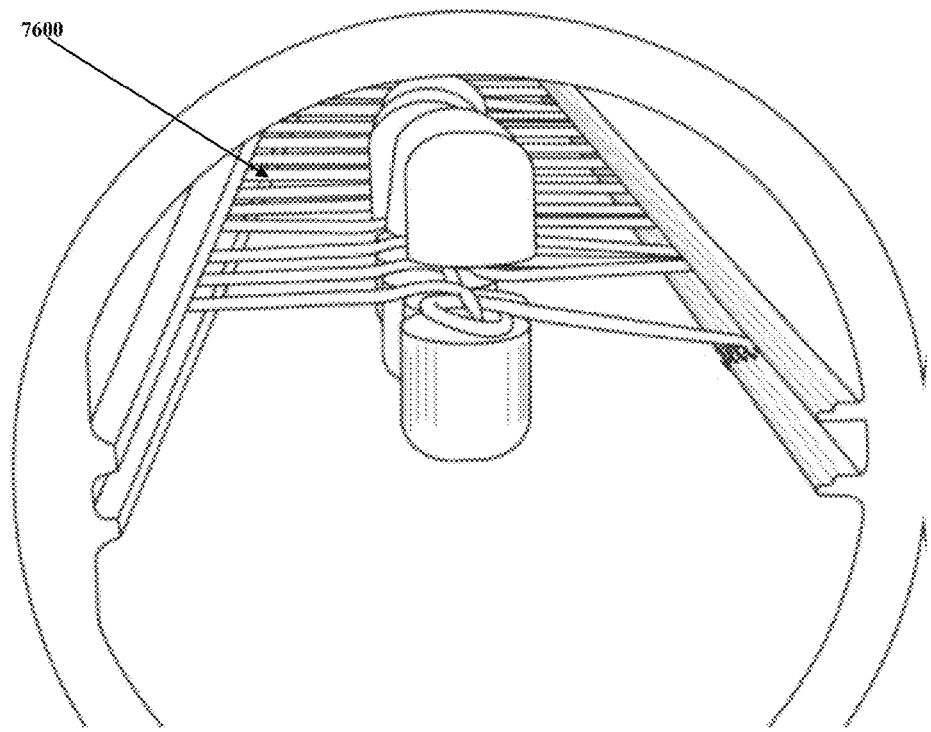

In another embodiment, FIGS. 74-76, we see an embodiment that uses the previously discussed LED strips 1802 that are placed one over the other (forming a bottom LED strips 3406, in one embodiment with a lensed LEDs, although in an alternate embodiment they may not need the lensing and may be any of the LEDs discussed in co-pending patent applications by Zykin (U.S. patent application Ser. Nos. 13/313,129 and 14/076,682) the content of which is incorporated by reference in their entirety). In a similar embodiment, the LED strip may consist only of the singular one 1802, whose individual LEDs are bent appropriately.

Instead of inserting them in the slot, the ends of the LED leads 7402, 7406 are inserted into MOLEX type compression fittings 7502 formed along a parallel set of strips 7506, 7508 (a first strip carrying intended to be powered by one voltage along one side, a second strip intended to be powered by the appropriate voltage along the other side) so that when the fittings 7502 are in close contact with the LED lead 7402, 7404 (shown closed in 7504) the units will remain there and in electrical contact. The strips assembly (1802, 7506, 7508) may then be inserted into a tube (in one embodiment 7600) to complete the assembly 7600.

While MOLEX is suggested above, any other type compression fitting where the LED leads 7402 are mechanically held, soldered, chemically bonded (using electrically transmitting glues), etc. may be used to hold the LED leads against the side strips 7506, 7508.

Figure 77:
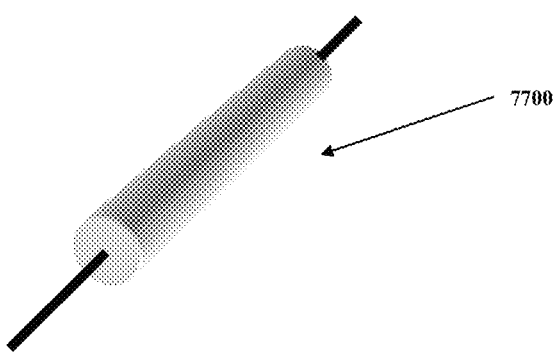
Figure 78:
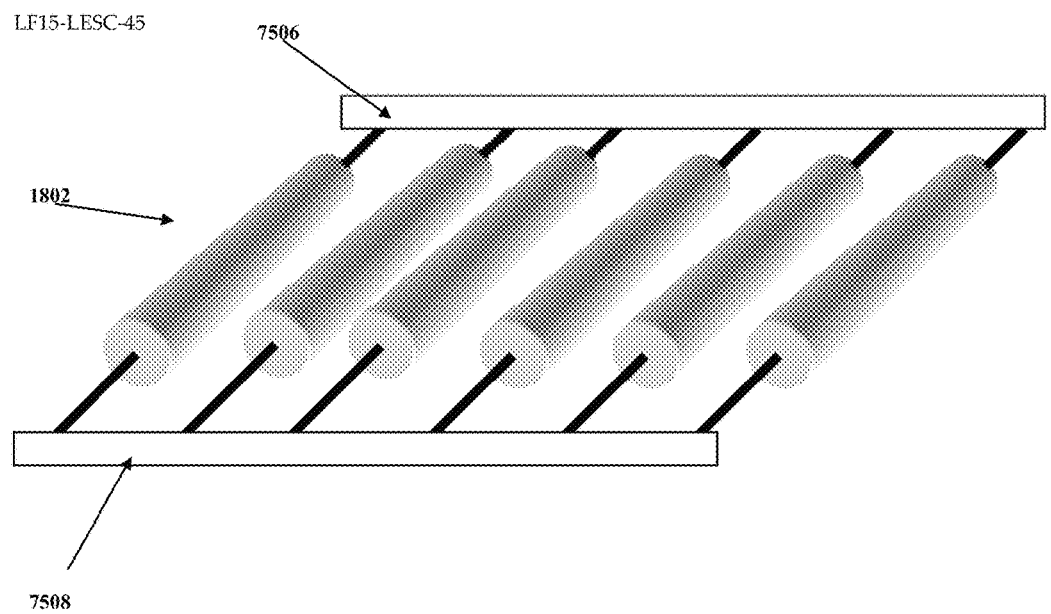

Referring to FIGS. 77-78, we see another embodiment, one where one or more LED sticks 7700 (as shown in Zykin U.S. application Ser. No. 14/076,682), are placed either directly or at an angle along a similar MOLEX type connectors (7506, 7508) strip, so that the straight (or angled) laid LED sticks 7700 are capable of being inserted into the tube or bulb 2400, 2500, 2600, 2700 including suitably modified T-5, T-8 or other suitable enclosure tube 2704. Said enclosure tube may have the aforementioned slots 2702 or be smooth and have the leads 3402 from the LED strips 1802 bent so they extend outside of the strips without significantly occluding the light emitted from the LEDs. Thus in addition to serving as a thermal radiator, they mechanically support the LED strips 1802 within the enclosure tube 2704.

Example 1

An LED light emitting bar, pole, filament, or candle could have a size of bar that is plastic covered in length of 30 mm, diameter of 2.5 to 3.5 mm, having a size of bar with connectors of 38-40 mm. In such an example, the quantity of light chips 200 within a single candle could be 26 pcs, in the 465-475 nm, having a serial connection.

It could be mfd. using flip chip technology, having a working voltage of 70-90 Volts, with current up to 30 mA, with a pulse of up to 100 mA. The LED chip size(s) 10×18, 10×20, 10×23, 10×26 mm, depending on the pad size being used. Some additional LEDs could be 10×18 or 20×20 mm with ESP. Thickness of LED die sapphire substrate in the 200-430 micron (0.2-0.43 mm). Thicker may be better (say −0.43 mm) as a standard for sapphire wafer. Each chip seats on it's own pad—"leg", having no reflector on the pad.

Top attach, using an eutectic placement, wire bonding: Au or Al with Au plated—chipper. Wire bonding: could be done by 1 wire to LED die, or by 2 wires on same LED die "Leg" size of L 5.0×W 0.7×T 0.7 or L 5.0×W 0.5×T 0.5 mm. LED die "Leg" goes throughout of plastic for 3.0-4.0 mm.

Type of plastic (Epoxy) cover: LED compatible, phosphor compatible, no need for weather protection, bar will be insulated inside and protected Plastic (Epoxy): mixed with phosphor, molded over metal "legs" with LED dies Plastic (Epoxy). Especially shaped for better light output and distribution, cylindrical stars. Microscopic view: bar inside, single wire bonding, eutectic die attach, die thickness ~10 mil In one embodiment, the system could be used as replacement for incandescent light bulbs filaments, since due to its shape it could also be used as replacement for "gas discharge line" in T8, T5 fluorescent tubes. There is no need for PCB (Printed Circuit Board), and the separated, independent heat sink for every LED die (chip) in a bar would provide one of the best heat dissipation ability for LED dies, due to the ratio of sizes between LED die and size of the heat sink.

Very low thermal resistance between LED die and heat sink, to ambient, due to eutectic bonding process. Very wide angle of light distribution, due to a shape of pad for die attach, of plastic (epoxy) lens. No needs for secondary optics, lens are molded at the same time of production.

Possibility to make heat sink electrically insulated, by using different die attachment methods.

CONCLUSION

In concluding the detailed description, it should be noted that it would be obvious to those skilled in the art that many variations and modifications can be made to the preferred embodiment without substantially departing from the principles of the present invention. Also, such variations and modifications are intended to be included herein within the scope of the present invention as set forth in the appended claims. Further, in the claims hereafter, the structures, materials, acts and equivalents of all means or step-plus function elements are intended to include any structure, materials or acts for performing their cited functions.

It should be emphasized that the above-described embodiments of the present invention, particularly any "preferred embodiments" are merely possible examples of the implementations, merely set forth for a clear understanding of the principles of the invention. Any variations and modifications may be made to the above-described embodiments of the invention without departing substantially from the spirit of the principles of the invention. All such modifications and variations are intended to be included herein within the scope of the disclosure and present invention and protected by the following claims.

The present invention has been described in sufficient detail with a certain degree of particularity. The utilities thereof are appreciated by those skilled in the art. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

The invention claimed is:

1. An LED light source assembly comprising:
a first metal wire frame extending along one side of said assembly and a second metal wire frame extending along the other side of said assembly;
wherein said first metal frame has one or more first branches electrically connected to said first frame, with each said first branch bar forming the first link of an LED chain and forming part of an LED pad to which all or part of an LED chip is mounted, and said first branch also being separated from said second frame by an LED pad gap;
a sequence of one or more cascade power bars forming the links in said LED chain, with each cascade bar having a first end and a second end, wherein said first end of said first cascade bar is across said first branch LED pad gap and said gap is electrically spanned in order to connect said LED chip across said LED pad gap, and said second cascade bar end forms an LED pad separated from the subsequent cascade bar within said LED chain by a similar LED gap which is similarly electrically spanned until the final cascade bar within said LED chain is reached;
a final branch located across an LED pad gap from said final cascade bar within said LED chain, so that said LED pad gap for said final LED chip in said LED chain is electrically spanned across said gap, wherein said final branch is electrically connected to said second wire frame upper portion; and
one or more molded structures mechanically connecting two or more of the group comprised by said first frame, second frame, first branch, final branch and cascade power bars at one or more locations.

2. The LED light source assembly of claim 1 wherein:
said molded structures comprise a first molded structure making contact at one or more points with said first frame, said first and said final branches and one or more of said cascade branches; and
said molded structures comprise a second molded structure making contact at one or more points with said second frame, said first and final branches and one or more of said cascade branches.

3. The LED light source assembly of claim 2 wherein said LED pad gap is electrically spanned using wire bond techniques.

4. The LED light source of claim 3, wherein:
one or more of said LED chain(s) are inserted into a container shaped as a tube and secured within said tube by one or more of said LED chain's LED package holder leads.

5. The LED light source assembly of claim 4, wherein:
one or more of said LED package holder leads are secured to slots within said tube interior.

6. The LED light source assembly of claim 3, wherein:
one or more of said LED chain(s) are inserted into a container shaped as a bulb or lamp.

7. The LED light source assembly of claim 6, wherein:
two or more of said LED chains are concatenated to form a supra chain.

8. The LED light source assembly of claim 7, wherein:
said supra chain is inserted into a container shaped as a tube and secured within said tube by said LED leads.

9. The LED light source assembly of claim 2, wherein:
said LED pad gap is electrically spanned using flip chip technology.

10. The LED light source of claim 9, wherein:
one or more of said LED chain(s) are inserted into a container shaped as a tube and secured within said tube by one or more of said LED chain's LED package holder leads.

11. The LED light source assembly of claim 10, wherein:
one or more of said LED package holder leads are secured to slots within said tube interior.

12. The LED light source assembly of claim 9, wherein:
one or more of said LED chain(s) are inserted into a container shaped as a bulb or lamp.

13. The LED light source assembly of claim 12, wherein:
two or more of said LED chains are concatenated to form a supra chain.

14. The LED light source assembly of claim 13, wherein:
said supra chain is inserted into a container shaped as a tube and secured within said tube by said LED leads.

15. The LED light source assembly of claim 14, wherein:
one or more of said LED chain(s) are inserted into a container shaped as a bulb or lamp.

16. The LED light source assembly of claim 1 wherein:
said molded structures comprise two or more molded structures, each said structure making contact with two or more points from the following structures; said first frame, said first branch, said final branch and one or more of said cascade branches.

17. The LED light source assembly of claim 16 wherein said LED pad gap is electrically spanned using wire bond techniques.

18. The LED light source assembly of claim 16, wherein:
said LED pad gap is electrically spanned using flip chip
   technology.

\* \* \* \* \*